US005746826A

United States Patent [19]
Hasegawa et al.

[11] Patent Number: 5,746,826
[45] Date of Patent: May 5, 1998

[54] METHOD AND APPARATUS FOR FORMING MICROSTRUCTURE BODY

[75] Inventors: Tsuyoshi Hasegawa; Shigeyuki Hosoki, both of Tokyo; Makiko Kohno, Kawasaki; Masakazu Ichikawa; Hitoshi Nakahara, both of Tokyo; Toshiyuki Usagawa, Yono, all of Japan

[73] Assignee: Hitachi, Ltd., Tokyo, Japan

[21] Appl. No.: 347,416

[22] PCT Filed: Apr. 5, 1994

[86] PCT No.: PCT/JP94/00561

§ 371 Date: Dec. 2, 1994

§ 102(e) Date: Dec. 2, 1994

[87] PCT Pub. No.: WO94/23445

PCT Pub. Date: Oct. 13, 1994

[30] Foreign Application Priority Data

Apr. 7, 1993 [JP] Japan .................. 5-080441
Jul. 13, 1993 [JP] Japan .................. 5-172857

[51] Int. Cl.⁶ .......................... C30B 25/04
[52] U.S. Cl. ............ 117/90; 117/94; 117/97; 117/106; 117/913; 117/920; 117/923
[58] Field of Search .............. 117/90, 94, 97, 117/106, 920, 913, 923

[56] References Cited

U.S. PATENT DOCUMENTS

| 5,013,683 | 5/1991 | Petreff et al. | 117/902 |
| 5,134,091 | 7/1992 | Chikyou et al. | 117/106 |
| 5,416,331 | 5/1995 | Ichikawa et al. | 250/492.2 |

FOREIGN PATENT DOCUMENTS

| 2162717 | 6/1990 | Japan . | |
| 2206112 | 8/1990 | Japan | 117/902 |
| 2283695 | 11/1990 | Japan | 117/902 |
| 3233926 | 10/1991 | Japan | 117/97 |
| 4154113 | 5/1992 | Japan | 117/902 |
| 4154114 | 5/1992 | Japan | 117/902 |

*Primary Examiner*—Robert M. Kunemund
*Attorney, Agent, or Firm*—Antonelli, Terry, Stout, & Kraus, LLP

[57] ABSTRACT

Utilizing rugged pattern of atomic size present on a crystalline substrate of a semiconductor such as silicon or selenium or the like, a microstructure body is produced on the substrate by forming a layer of a first element of one monolayer or less by arranging at the position of the substrate most stable in energy formed by ruggedness the atoms of the first element such as gold, silver, copper, nickel, palladium, platinum or an element of group IV and then depositing successively atoms of at least one second element of group III, group IV and group V on only at a part of the surface of the substrate on which said layer of one monolayer or less by vapor deposition, sputtering or the like.

40 Claims, 23 Drawing Sheets

METHOD AND APPARATUS FOR FORMING MICROSTRUCTURE BODY

TECHNICAL FIELD

The present invention relates to a method for forming a microstructure body on an inorganic substrate and an apparatus used therefor. In more detail, it relates to a method for producing a microstructure body on an inorganic substrate using a crystal growing technique, the microstructure body being used for producing electronic devices, photo devices, especially quantum interference devices of high speed, low consumption and high efficiency and an apparatus used therefor.

BACKGROUND ART

In order to form a semiconductor device, it is necessary to produce a structure comprising a substrate having microstructure body such as a thin film, a fine wire or the like or having a micro-layer on the surface of the substrate to form microstructure body specified on the directions perpendicular and parallel to the surface.

For formation of thin films, fine wires, etc., the chemical vapor phase growing method (hereinafter referred to as a "CVD method") and the molecular beam epitaxy method (hereinafter referred to as a "MBE method") have been widely known. The CVD method is higher in the film growing speed than the MBE method and is used for forming a film of several ten nm or more in thickness and on the other hand, the MBE method is used for forming a film in the unit of an atomic layer. In most of the current methods to produce semiconductor devices, the CVD method is used, but recently formation of thin films by the MBE method is also being used with the ongoing fining of integrated devices.

When semiconductor devices are produced by the MBE method, as vapor deposition on a substrate is carried out in ultra-high vacuum, the growth is controlled in the unit corresponding to an atomic layer, for example, by detecting the oscillation phenomenon (period of the oscillation corresponds to one atomic layer) of reflection electron diffraction intensity from the substrate. Furthermore, in order to impart the thus grown film with a function as a device, it is necessary to inject a dopant which supplies a carrier during the growth. However, this dopant has the problem that it acts also as a scattering body for the carrier to deteriorate the performance of the device. For solving this problem, there has been developed a method according to which when two substances differing in width of forbidden band, for example, GaAs and AlGaAs or SiGe and Si are heterogrown at a steepness of atomic layer level, the dopant is injected into only the thin film comprising the substance of larger width of forbidden band such as AlGaAs or Si and the carrier is injected into only the thin film comprising the substance of small width of forbidden band (Japanese Patent Kokoku (Examined Publn.) No.59-53714). In this case, since the carrier moves through only the thin film comprising the substance of small width of forbidden band and free from the dopant, the carrier is not scattered by the dopant and therefore, performances of the device are not deteriorated and ultra-high speed operation of the device is possible.

On the other hand, for formation of microstructure body specified in interplanar direction, there have been employed lithography methods which use light, electron beam, X rays, ion beam, etc. and methods which comprise directly processing the surface using electron beam or ion beam. For example, the lithography technique is described in "Oyo Butsuri (Applied Physics)", Vol.61, No.4 (1992), pages 366–367. Various means such as reduction projection exposing and phase shifting method have been attempted. It is said that 0.1 Jm is nearly the limit as the minimum processing size. The direct processing of the surface using ion beam is described in "Shinku (Vacuum)", Vol.35, No.5 (1992), pages 512–519. It is stated that the processing accuracy depends on the beam diameter and 10 nm would be the limit. It is also stated that as compared with the lithography method, resolution is considerably high while fluctuation of about 5 nm in line width occurs.

Furthermore, as a method for forming a structure specified in interplanar direction by controlling the growth, a method is proposed according to which the above substance of small width of forbidden band is grown by controlling at atomic level in the interplanar direction also in the substance of large in width of the forbidden band utilizing an atomic step present on the surface of the substrate (e.g., see Japanese Patent Kokai (Unexamined Publn.) No.4-154114). In this case, when the area of the substance of small in width of forbidden band in which carrier is entrapped is less than 10 nm, a quantum interference device which is operated by controlling the phase of wave of the carrier can be realized. An ultra-high speed, low-consumption and high integration device is obtained since wave property of carrier is utilized.

As described above, the conventional techniques are useful for realizing the ultra-high speed, the low-consumption and the high efficiency of semiconductor high integration devices. However, if integration of electron devices is further increased in the future, the micro processing method used at present can attain the object with difficulty. Especially, for those which require a processing accuracy in the order of nanometer like the quantum effect devices, a new method is needed. This is for the following reasons. That is, the former of the above conventional techniques suffers from the problem that the moving area of the carrier and the existing area of the dopant are separated in the direction of thickness, but since the carrier is not trapped in the area of 10 nm or less, the quantum interfering effect cannot be expected. Furthermore, the latter of the above conventional techniques has the problem that since the existing area of the dopant extends over the whole device, the carrier is subjected to scattering by the dopant in the area where the carrier moves or is trapped and the quantum state is disturbed and as a result, the device does not sufficiently function as a quantum interfering device.

DISCLOSURE OF INVENTION

The present invention has been made to solve the above problems encountered in the conventional techniques. The object of the present invention is to provide a crystal growing method and a micro processing method capable of providing accuracy in the level of nanometer necessary for realizing quantum interfering devices, etc. and an apparatus used for carrying out the methods.

In order to attain the above object, the present invention employs basically the following means. That is, utilizing a rugged pattern having a size of atomic order and present on a substrate, atoms of a first element are arranged on a portion which is the most stable in energy and is formed by the ruggedness, thereby forming a layer thinner than one monolayer and then, atoms of at least one second element are deposited on a part of the surface of the substrate having the atom layer. Thus, a micro-structure body or a structure having a micro-layer is produced.

The term "thinner than one monolayer" used here means that one monolayer is not formed on the whole surface of the substrate, but does not mean that atoms are sporadically and optionally present on the surface. As mentioned below, it means a structure body having a certain shape and formed as one monolayer on only a part of the surface of the substrate.

The structure of the present invention having a microstructure body or a micro-layer basically comprises a strip-like structure comprising an atomic layer of at most about 10 nanometers in width and from one monolayer to an optional number of monolayers in thickness or a box-shaped structure having a length, a broad and a height of an optional number of stacked atoms, respectively, and various patterns such as a wiring pattern can be constituted by combination of the structures. Furthermore, a multilayer structure can be formed by stacking layers of different elements by repeating deposition of the atom layer. Each layer of the multilayer can comprise one element or two or more elements. Moreover, it is also possible to form a groove on the surface of the substrate by removing the once deposited atomic layer.

As the method for forming the atomic layer by deposition used in the present invention, the most preferred are the conventionally known chemical vapor phase growing method (hereinafter referred to as "CVD method") and molecular beam epitaxy method (hereinafter referred to as "MBE method") and in some case, there may be employed a method of stacking atoms one by one utilizing a probe of a scanning tunneling microscope. These means are referred to as "deposition" in the present invention.

The present invention resides in forming the above-mentioned microstructure body on the surface of a substrate and a crystal of inorganic materials can be used as the substrate. The surface of an inorganic crystal inherently has an ruggedness in the order of atomic size. For example, it has such a state as steps of one or two atomic height being arranged and the edge just under the step is a place stable in energy. Furthermore, for example, an island-like ruggedness in the order of atomic size is formed artificially, for example, by utilizing a probe of a scanning tunneling microscope, whereby the similar place stable in energy can be produced. Furthermore, when a lattice defect is present on the surface of the crystal body, there is generated a place which is relatively stable in energy. The present invention is to produce a very minute structure having a width in the order of nanometer utilizing such place as stable in energy.

The inorganic crystal body used in the present invention is most preferably a semiconductor. The semiconductor includes single element semiconductors such as silicon, germanium, selenium and tellurium, compound semiconductors of groups III–V such as gallium-arsenide and indium-antimony, and compound semiconductors of groups II–VI such as cadmium sulfide and zinc oxide.

In the present invention, in order to attain the dimensional accuracy at the level of nanometer, there are provided a means to grow a thin layer of a first element having an optional width along the step on the surface of a substrate and a means to grow thereafter a second element on the surface of the substrate. In this case, a combination of the kind of the first and second elements, their atomic arrangements on the surface of the substrate, the composition of the substrate and the surface structure are used and temperature of the substrate is controlled so that the second element does not grow on the thin film of the first element. Furthermore, there are provided a means to control the substrate temperature for desorbing the thin layer of the first element at a temperature lower than the melting point of the substrate, a means to locally remove the thin layer of the first element, and a means to desorb the first element or remove it utilizing a probe of a scanning probe microscope and thereafter locally supply another material such as carbon or an electrically conductive organic material.

In order to perform micro processing into optional shapes, it is necessary to form an optional step shape by locally supplying a semiconductor material to form an island structure or by locally removing a semiconductor material. For this purpose, there are provided a means to locally supply a semiconductor material, a means to remove it, and additionally a means to grow a thin film of a metal, which promotes growth of the crystal, on another part of the surface of the semiconductor. These can be performed by using corpuscular beams such as electron beam and ion beam or by using scanning probe microscopes such as scanning tunneling microscope. Furthermore, a microscopic apparatus for monitoring the processing is also provided.

The inventors have found the conventionally unknown phenomenon that for some combinations of the first element (such as gold) and the material of the substrate (such as silicon) with the surface structure, crystal of the second element does not grow on the thin layer of the first element formed on the substrate even when the second element is supplied onto the thin layer of the first element. For example, this is performed with the fivefold structure of Au on the surface of Si (111) explained in the following example. The present invention is based on this finding. Hitherto, the micro processing has been conducted by the method as explained on the prior art hereabove. However, if the above-mentioned natural phenomenon found for the first time now is utilized, micro processing can be easily carried out. The characteristics of the micro processing according to the present invention will be explained below.

Since width of the thin layer of the first element grown on the surface of the substrate can be controlled at the level of nanometer depending on the amount of the element supplied, supermicro processing can be effected and no fluctuation of width of lines occurs. Moreover, since the crystal of the second element does not grow on the thin layer of the first element, a metal thin line can be formed in the groove of a width in the order of nanometer. Furthermore, since the first element can be desorbed without breaking the groove formed on the substrate, a groove having a width in the order of nanometer can be formed on the surface of the substrate. In addition, by supplying another second element into the groove, a microstructure can be easily formed using an optional material. When an element which promotes growth of crystal is used as this another second element, crystal can be grown selectively in the area of a width in the order of nanometer. Further, since the first element grows along the step, a microstructure body of an optional shape can be formed by forming a step of an optional shape. Moreover, since growth of crystal can be promoted at another portion, a three-dimensional microstructure body can be easily formed.

The characteristics of the present invention will be apparent by the following explanation based on the examples.

An action of one embodiment of the present invention will be explained using FIG. 1 with selecting silicon as a substrate, germanium as a first element and gallium of p-type dopant as a second element.

When the surface of silicon substrate 1 is cut with slightly inclined from a main crystal face such as (001), (111) or the like and is annealed in an ultra-high vacuum, silicon atomic steps 2 are regularly formed on the surface of the silicon substrate 1 as shown in FIG. 1-a. When germanium 3 is vapor deposited on the surface of the silicon substrate 1 kept at a given temperature, for example, 500°–900° C. in an ultra-high vacuum, for example, $1\times10^{-7}$ Torr or higher, germanium thin layer 4 is grown partially on the surface of the silicon substrate 1, for example, by step-flow growth according to which germanium deposits on the silicon steps 2 and grows thereon (FIG. 1-b). That the step growth proceeds is confirmed, for example, by detecting that no vibration phenomenon occurs in the intensity of reflection electron diffraction at the surface of the silicon substrate 1.

When gallium 5 of one monolayer is deposited on the surface of the silicon substrate 1 on which germanium thin film has been partially grown and then the silicon substrate 1 is kept at a temperature at which gallium on the surface of germanium is released (in the direction of arrow), but gallium on the surface of silicon is not released, gallium of one monolayer deposits on only the surface of silicon (FIG. 1-c). For example, in the case of (111) surface, the releasing temperature of gallium on the surface of silicon is about 650° C. and that of gallium n the surface of germanium is about 500° C.

Silicon thin layer 7 is grown on the whole surface by vapor deposition of silicon 6 on the surface in an ultra-high vacuum (FIG. 1-d). In this case, the silicon substrate 1 is kept at a temperature at which two-dimensional nuclear growth of the silicon thin layer 7 occurs. That the two-dimensional nuclear growth occurs is confirmed by detecting that vibration phenomenon occurs in the intensity of reflection electron diffraction at the surface. In the course of this two-dimensional nuclear growth, morphology on the surface before growth does not change. It is known that, germanium 3 and gallium 5 have a property of easy surface segregation by replacing with silicon 6 vapor deposited on the silicon substrate 1 during the growth. For example, when temperature of silicon substrate 1 on which two-dimensional nuclear growth of silicon proceeds is 330° C., in the case of silicon 6 growing by 1 nm, 25% of germanium of the germanium thin layer 4 which has grown on the silicon substrate 1 is taken into the thin layer and 75% is segregated at the surface and 1% of gallium is taken into the silicon thin layer and 99% is segregated at the surface.

In this way, in the area where germanium has grown, a silicon-germanium mixed crystal thin layer 8 is formed due to the replacing of germanium with silicon and on the other hand, in the area where germanium has not grown, a silicon thin layer 7 into which p-type gallium has slightly been taken is formed. For example, when the temperature of the silicon substrate 1 is 330°C., the concentration of gallium dopant is about $10^{19}/cm^3$ and this value corresponds to the doping of high concentration. Since the silicon-germanium mixed crystal thin layer 8 is smaller than silicon in width of forbidden band, the dopant is doped by the process of FIG. 1-d only in silicon which is a substance larger in width of forbidden band and the thin layer comprising the substance smaller in the width of forbidden band is also controlled in in-plane direction and can be grown. The proportion of the silicon-germanium mixed crystal or the dopant concentration of gallium can be controlled by changing the temperature of the silicon substrate 1 and the vapor deposition rate of silicon 6. Furthermore, only by annealing of the silicon substrate 1, the in-plane distribution of the deposited gallium 5 does not change due to diffusion. Therefore, it is also possible to carry out annealing at a temperature lower than the temperature at which the deposited gallium 5 is released, in order to improve crystallinity of the silicon-germanium mixed crystal thin layer 8 or the silicon thin layer 7 without changing the area in which gallium is doped, by annealing at a temperature lower than the temperature at which the deposited gallium 5 is released. In this way, a thin layer can be grown by specifying interface or surface at an accuracy at the level of atom in in-plane direction and perpendicular direction (growing direction).

Furthermore, when the silicon substrate 1 is kept at a temperature higher than the temperature at which the deposited gallium 5 is released from the surface, the structure of FIG. 1-e is obtained. Moreover, the structure shown in FIG. 1-f is obtained by growing the silicon thin layer 7 by the step flow growth according to which the vapor deposited silicon is trapped by the atomic step 9 of the silicon-germanium mixed crystal thin layer 8 on the surface. This surface structure is equivalent to FIG. 1-a, and by repeating again the procedure of FIG. 1-b to FIG. 1-f, the structure of FIG. 1-f can be continuously produced in the direction of thickness as shown in FIG. 1-g.

The action described above can also be applied to the case where germanium 3 is vapor deposited and grown in place of the silicon 6 vapor deposited in FIG. 1-d. In this case, a germanium thin layer grows at the portion of the silicon-germanium mixed crystal thin layer and a silicon-germanium mixed crystal thin film grows in place of the silicon thin layer 7. Furthermore, it is also possible to vapor-deposit and grow silicon and germanium in combination or silicon, germanium and carbon in combination in place of the silicon 6 vapor-deposited in FIG. 1-d. In this case, at the portion of the silicon-germanium mixed crystal thin layer 8, a silicon-germanium mixed crystal thin layer or silicon-germanium-carbon mixed crystal thin layer higher in germanium concentration grows, and in place of the silicon thin layer 7, there grows a silicon-germanium mixed crystal thin layer or silicon-germanium-carbon mixed crystal thin layer lower in germanium concentration.

BEST MODE FOR CARRYING OUT THR INVENTION

Figure 1A:
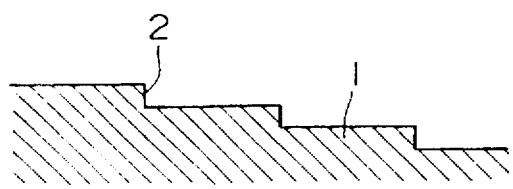
FIGS. 1a–1f are a schematic sectional views which show the principle of one embodiment of the method according to the present invention.
Figure 1B:
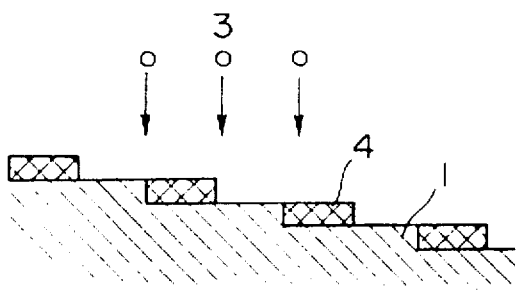
Figure 1C:
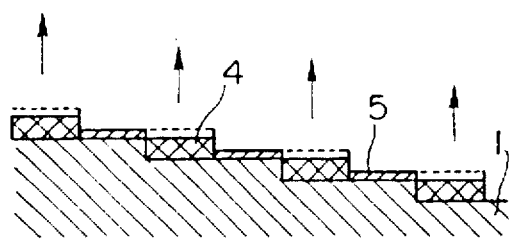
Figure 1D:
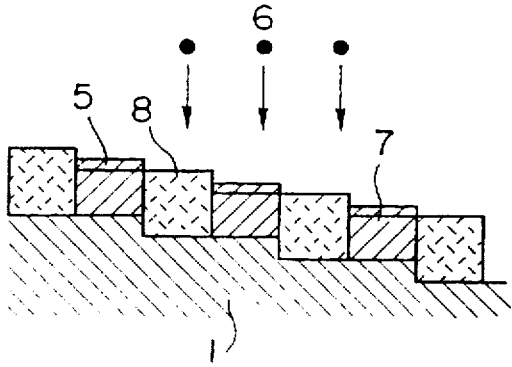
Figure 1E:
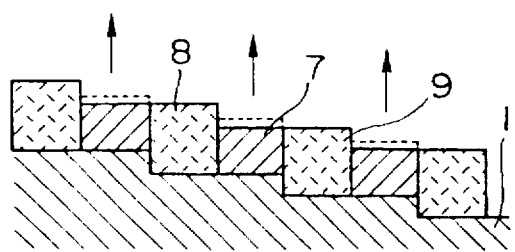
Figure 1F:
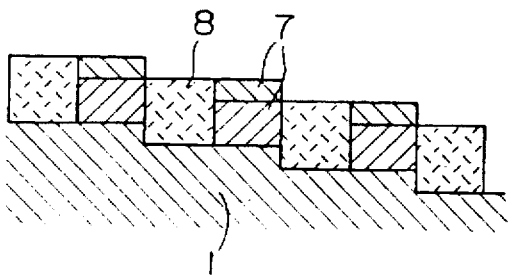
Figure 1G:
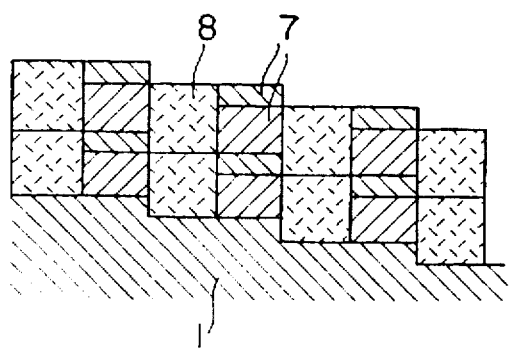
Figure 2A:
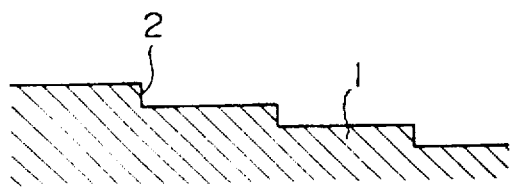
FIGS. 2a–2g are a sectional views which show a method of forming a silicon-germanium mixed crystal thin layer in the form of a line in a silicon thin layer.
Figure 2B:
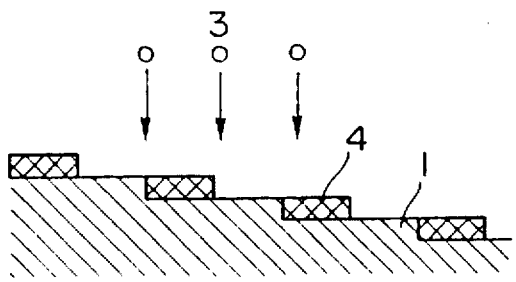
Figure 2C:
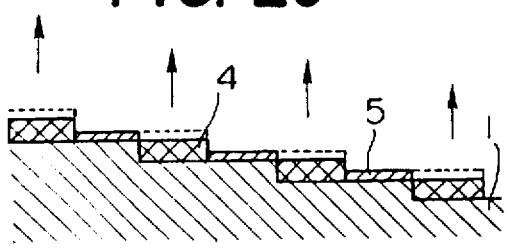
Figure 2D:
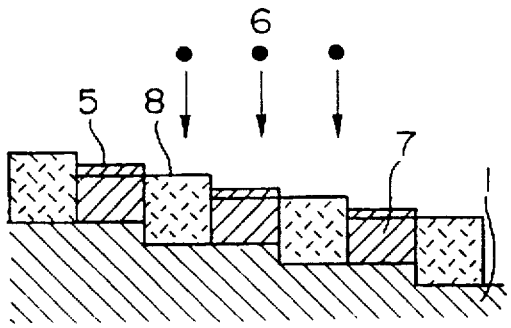
Figure 2E:
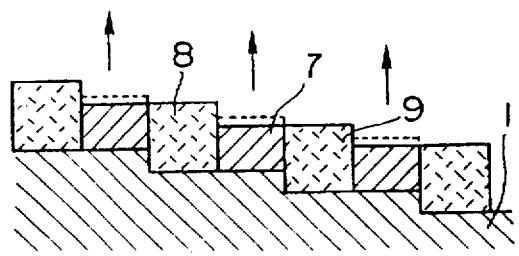
Figure 2F:
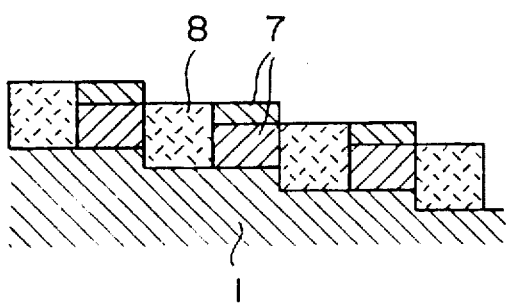
Figure 2G:
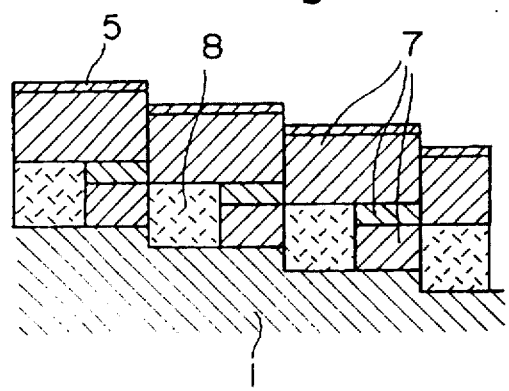
Figure 3A:
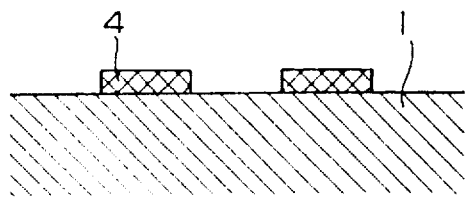
FIGS. 3a–3f are schematic sectional views which show a method of forming a silicon-germanium mixed crystal thin layer in the form of a box in a silicon thin layer.
Figure 3B:
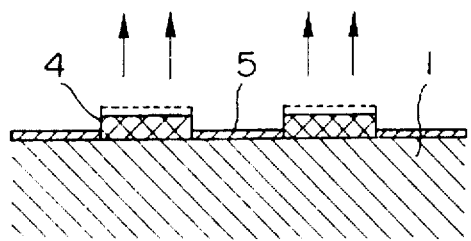
Figure 3C:
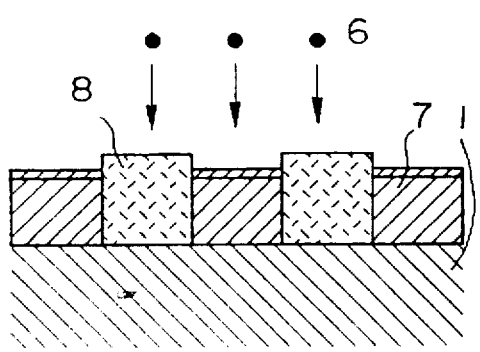
Figure 3D:
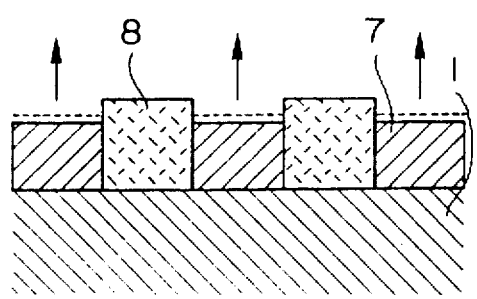
Figure 3E:
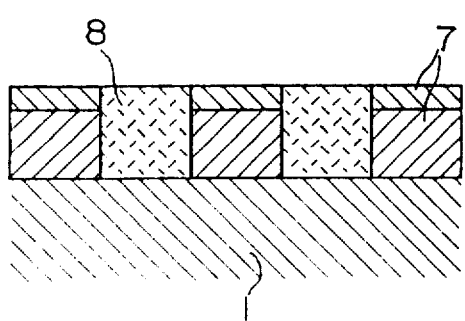
Figure 3F:
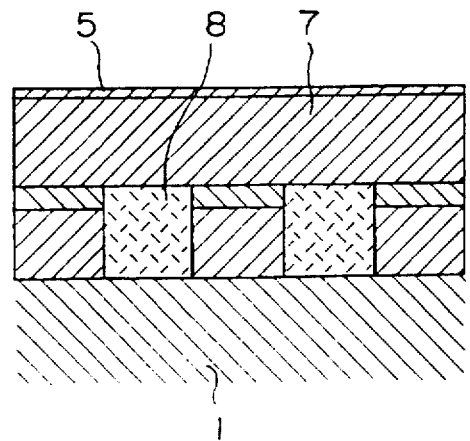
Figure 4A:
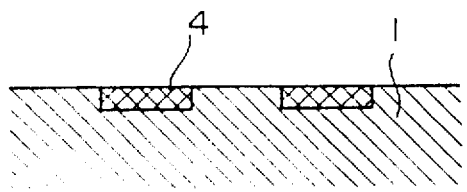
FIGS. 4a–4e are schematic sectional views which show another method of forming a silicon-germanium mixed crystal thin layer in the form of a box in a silicon thin layer.
Figure 4B:
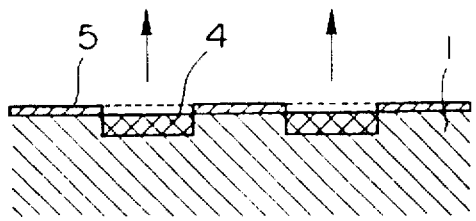
Figure 4C:
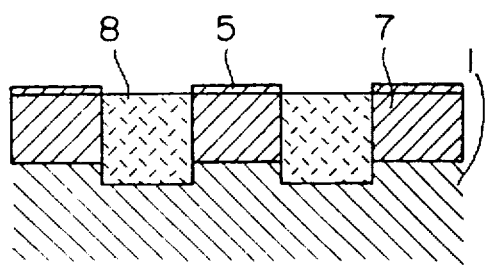
Figure 4D:
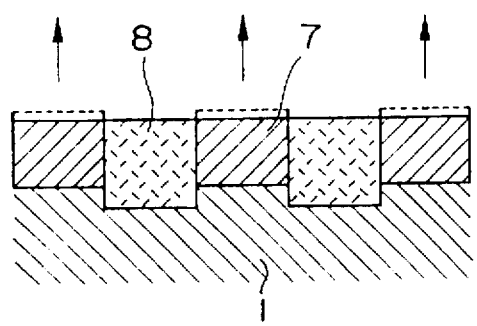
Figure 4E:
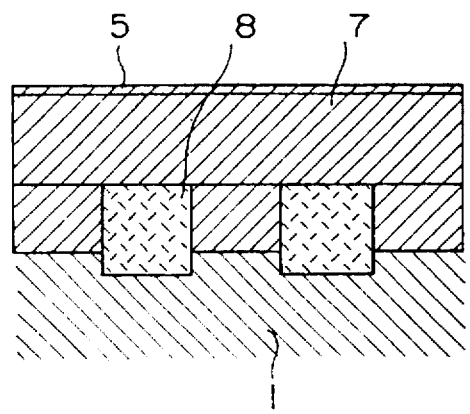

The present invention will be explained in more detail below referring to FIGS. 2–8 with selecting silicon as the substrate, germanium as the first element and gallium of p-type dopant as the second element.

EXAMPLE 1

FIG. 2 shows an example where a silicon-germanium mixed crystal thin layer 8 is grown in the form of a narrow and long microstructure body (10 nm in in-plane direction and 10 atomic layer or less in perpendicular direction) in a silicon thin layer 7 in which a dopant is present. The procedures shown in FIG. 2-a to FIG. 2-f are the same as those in FIG. 1-a to FIG. 1-f. Furthermore, after depositing one monolayer of gallium on the whole surface shown in FIG. 2-f, silicon 6 is grown under the conditions of the two-dimensional nuclear growth mentioned above and as a result, the silicon-germanium mixed crystal thin layer 8 in the form of a narrow and long microstructure body is formed in the silicon thin layer 7 in which the dopant is present. When gallium of one monolayer is deposited on the silicon-germanium mixed crystal thin layer 8, replacement between germanium and silicon is hindered owing to the effect of surface segregation of gallium and a steep interface between the silicon-germanium mixed crystal thin layer 8 and the silicon thin layer 7 as shown in FIG. 2-g is obtained. By repeating the procedures of FIG. 2-c to FIG. 2-g, any number of the linear silicon-germanium mixed crystal thin layers 8 can be formed in the direction of thickness.

EXAMPLE 2

FIG. 3 shows an example of growing the silicon-germanium mixed crystal thin layer 8 in the form of a box in the doped silicon thin layer 7. The germanium thin layer 4 is grown in the form of a rectangle on the silicon substrate 1 by the method shown in the example of FIG. 6. (FIG. 3-a). After depositing gallium 5 of one monolayer on the whole surface, the silicon substrate 1 is kept at a temperature higher than the temperature at which gallium 5 on the germanium thin layer 4 is released, thereby to deposit gallium 5 only on the surface of silicon (FIG. 3-b). Furthermore, the silicon thin layer 7 is formed by two-dimensional nuclear growth to form a box-shaped silicon-germanium mixed crystal thin layer 8 as shown in FIG. 3-c. The silicon substrate 1 is kept at higher than the temperature at which the surface segregated gallium 5 is released, thereby removing the gallium 5 from the surface (FIG. 3-d). Further, silicon thin layer 7 is grown by step flow growth to make the surface flat (FIG. 3-e). Furthermore, by repeating the procedures of from FIG. 3-a to FIG. 3-e, the length in the direction of thickness of the silicon-germanium mixed crystal thin layer 8 can be controlled. Moreover, as shown in FIG. 3-f, gallium 5 of one monolayer is deposited on the whole surface shown in FIG. 3-e and then, the silicon thin layer 7 is grown, whereby the silicon-germanium mixed crystal thin layer 8 can be discretely grown in the doped silicon thin layer 7. A great number of layers of the above structure can 10 be formed by repeating the procedures of from FIG. 3-a and FIG. 3-f.

EXAMPLE 3

FIG. 4 shows another example of growing the silicon-germanium mixed crystal thin layer 8 in the form of a box in the doped silicon thin layer 7. A groove is formed on the silicon substrate 1 by the method shown in FIG. 7 and the germanium thin layer 4 is grown in the form of a rectangle (FIG. 4-a). One monolayer of gallium 5 is deposited on the whole surface and then, the silicon substrate 1 is kept at higher than the temperature at which the gallium 5 on the germanium thin layer 4 is released, thereby depositing gallium 5 only on the silicon surface (FIG. 4-b). Moreover, the silicon thin layer 7 is formed by two-dimensional nuclear growth to form the box-shaped silicon-germanium mixed crystal thin layer 8 as shown in FIG. 4-c. The silicon substrate 1 is kept at higher than the temperature at which the surface segregated gallium 5 is released, thereby removing the gallium 5 from the surface (FIG. 4-d). Furthermore, by repeating the procedures of from FIG. 4-a to FIG. 4-d, the length in the direction of thickness of the silicon-germanium mixed crystal thin layer 8 can be controlled. Moreover, as shown in FIG. 4-e, one monolayer or less of gallium 5 is adsorbed onto the whole surface shown in FIG. 4-d and then, the silicon thin layer 7 is grown, whereby the silicon-germanium mixed crystal thin layer 8 can be discretely grown in the doped silicon thin layer 7. A great number of layers of the above structure can be formed by further repeating the procedures of from FIG. 4-a and FIG. 4-d.

Figure 5:
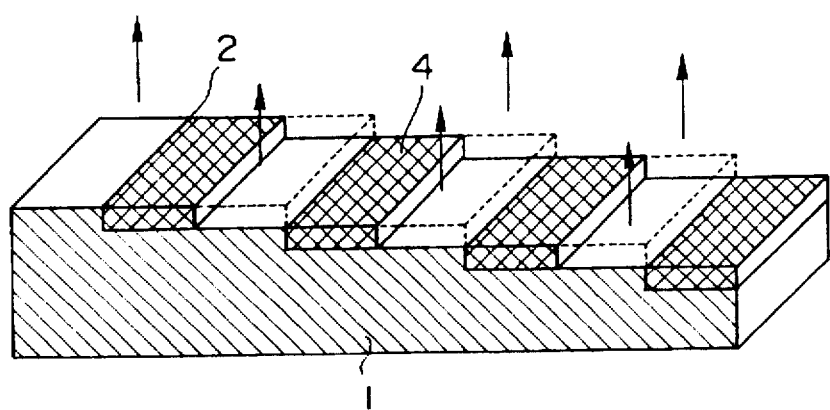
FIG. 5 is a schematic sectional view which shows a method of forming a linear germanium thin layer on a silicon substrate.

FIG. 5 shows an example of growing germanium thin layer 4 partially on the surface utilizing the silicon atomic step 2 on the surface of the silicon substrate 1. This is formed by utilizing the property that when the germanium thin layer 4 is grown on the whole surface of the silicon substrate 1 and then, is kept at higher than the temperature at which the germanium thin layer 4 is released from the surface of the silicon substrate 1, the germanium thin layer 4 evaporates from the edge of the steps. The width of the germanium thin layer 4 is controlled, for example, by detecting decrease of reflection electron diffraction intensity at the surface of the germanium thin layer 4.

EXAMPLE 4

Figure 6A:
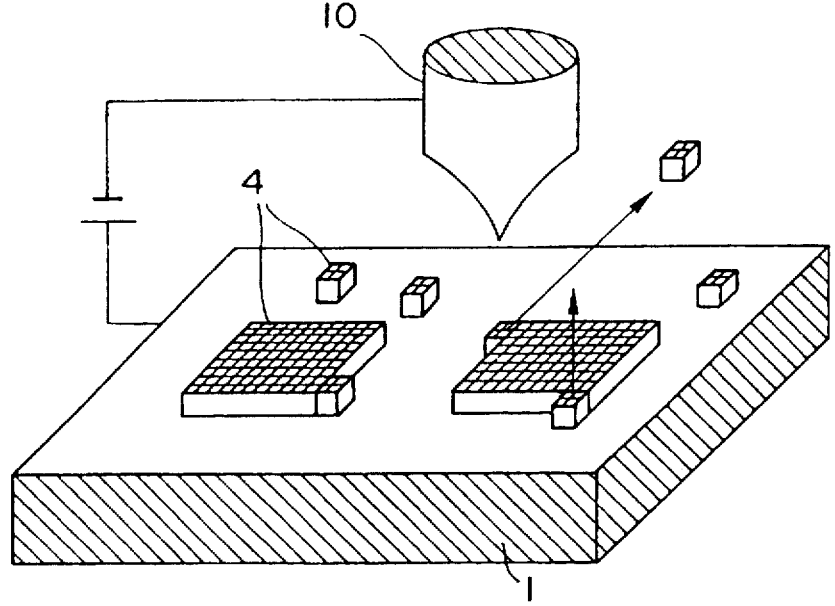
FIGS. 6a and 6b are schematic sectional views which show a method of forming a rectangular germanium thin layer on a silicon substrate using a scanning tunneling microscope.
Figure 6B:
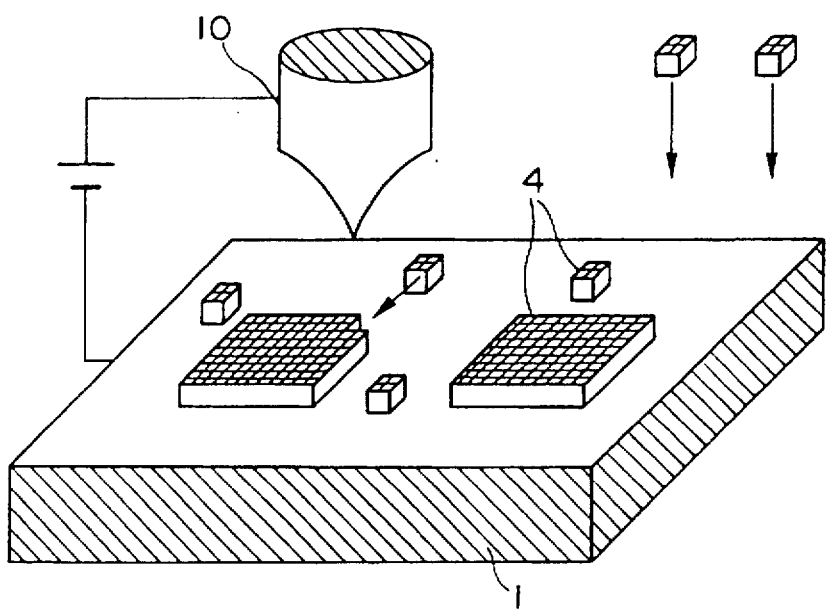

FIG. 6 shows an example of growing germanium thin layer 4 partially on the surface of the silicon substrate 1 using a probe of a scanning tunneling microscope. In FIG. 6-a, after the germanium thin layer 4 is grown on the whole surface of the silicon substrate 1, with identifying the portions on the surface by the probe 10 of the scanning tunneling microscope, the probe 10 of the scanning tunneling microscope is fixed at a specific point and a positive or negative electric field (about 1 V/Å) in respect to the silicon substrate 1 is applied to the probe 10 of the scanning tunneling microscope, whereby germanium atoms which constitute the germanium thin layer 4 are field-evaporated to partially form the germanium thin layer 4 on the surface of the silicon substrate 1. Alternatively, after the germanium thin layer 4 grown on the whole surface is partially removed by field evaporation using the probe 10 of the scanning tunneling microscope, the germanium thin layer 4 is evaporated from the portions at which the germanium thin layer 4 has been partially removed at a temperature higher than the temperature at which the germanium thin layer 4 is released from the surface of the silicon substrate 1. In FIG. 6-b, the deposited germanium atoms which are present being scattered on the surface of the silicon substrate 1 when germanium 3 is vapor deposited are accumulated by electric force generated when a voltage is applied to the probe 10 of the scanning tunneling microscope thereby partially forming the germanium thin layer 4 on the surface of the silicon substrate 1.

EXAMPLE 5

Figure 7A:
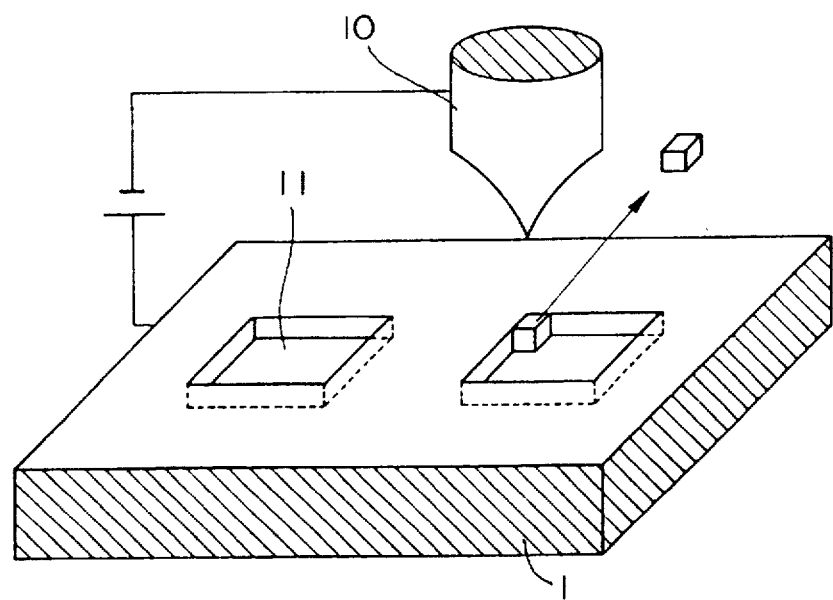
FIGS. 7a and 7b are schematic sectional views which show another method of forming a rectangular germanium thin layer on a silicon substrate using a scanning tunneling microscope.
Figure 7B:
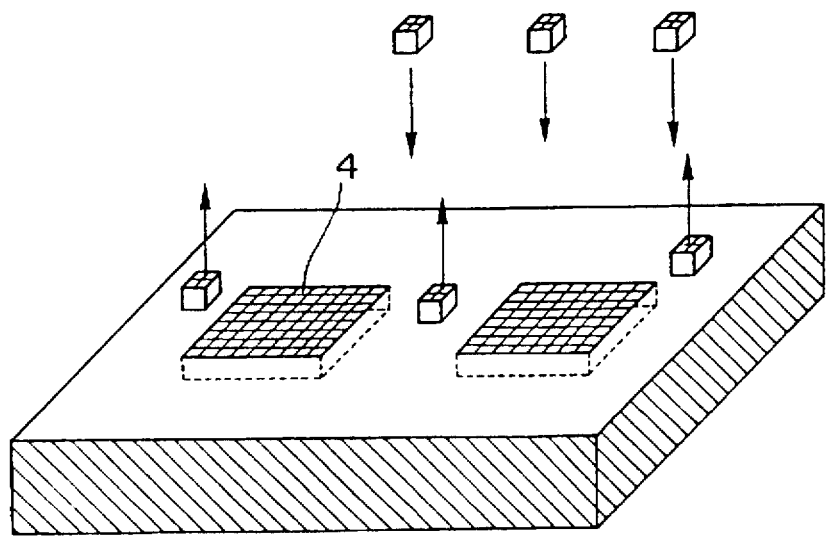

FIG. 7 shows another example of growing germanium thin layer 4 partially on the surface of the silicon substrate 1 using a scanning tunneling microscope. In FIG. 7-a, an electric field which is positive or negative in respect to the silicon substrate 1 (about 1 V/Å) is applied to the probe 10 of the scanning tunneling microscope, whereby silicon atoms constituting the silicon substrate 1 are field-evaporated (as shown by arrow) to form a groove 11 on the silicon substrate 1. On the surface is deposited germanium in an amount larger than necessary to fill up the groove 11 to form a germanium thin layer in the groove 11. Removal of the excess germanium atoms deposited on the surface (shown by the upward arrow) is carried out by keeping the silicon substrate 1 at the temperature at which the above deposited germanium atoms are released.

EXAMPLE 6

Figure 8A:
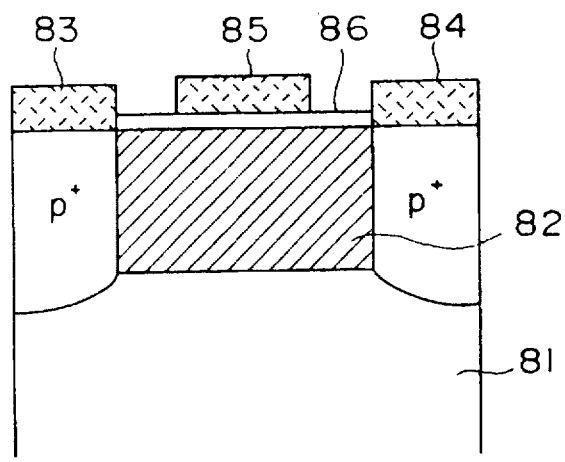
FIGS. 8a and 8b are schematic sectional views which show a semiconductor electronic-photo device produced by the method of the present invention.
Figure 8B:
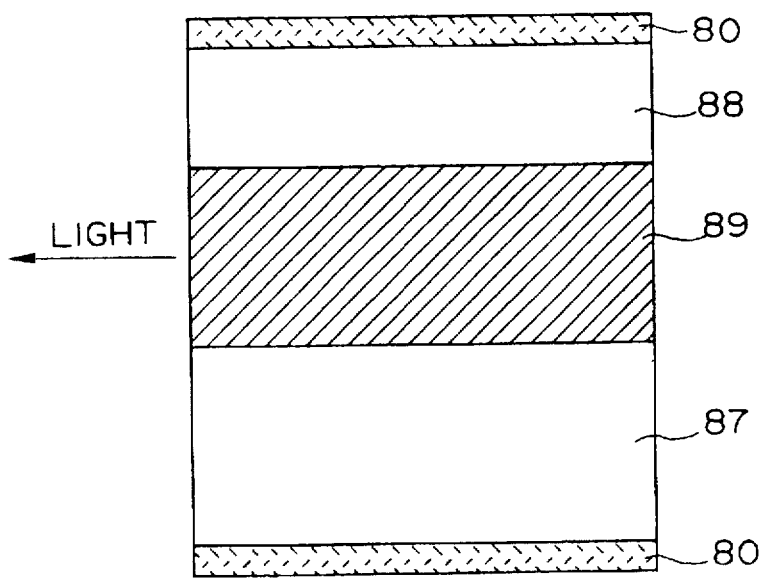
Figure 9A:
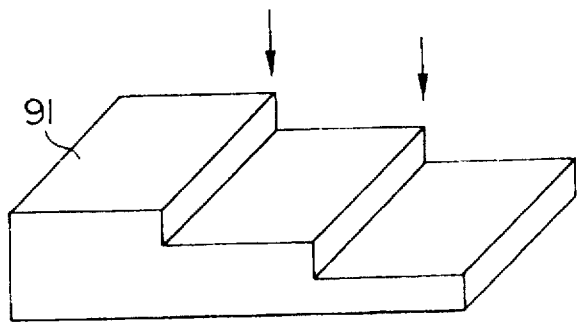
FIGS. 9a–9d are schematic sectional views which show the process of another embodiment of the present invention.
Figure 9B:
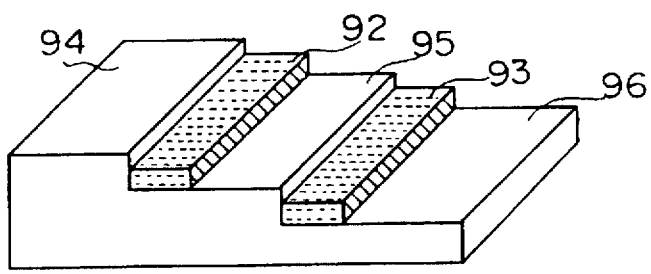
Figure 9C:
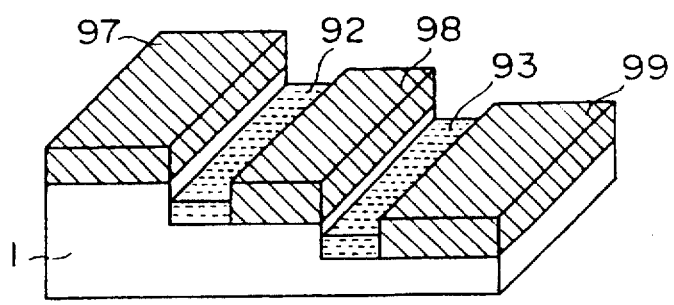
Figure 9D:
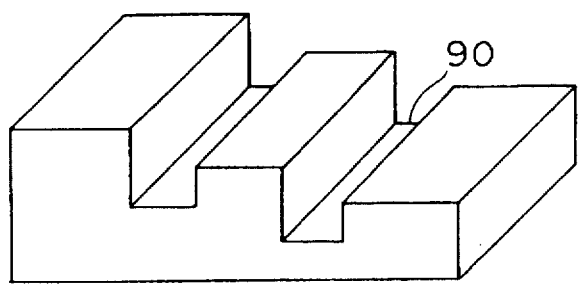
Figure 10A:
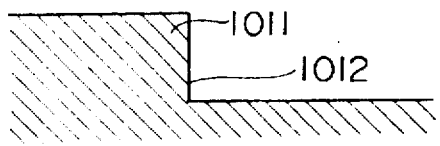
FIGS. 10a–10g are schematic sectional views which show the principle of another embodiment of the present invention.
Figure 10B:
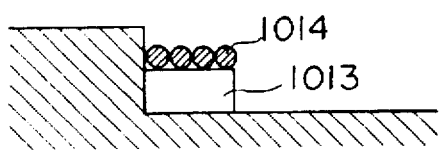
Figure 10C:
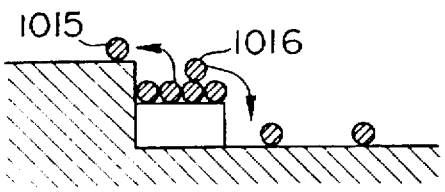
Figure 10D:
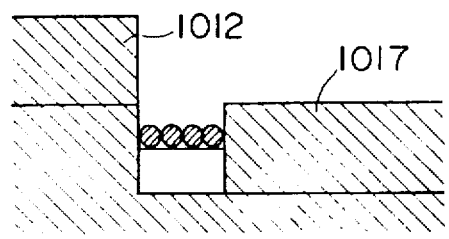
Figure 10E:
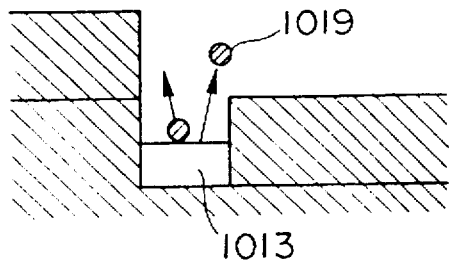
Figure 10F:
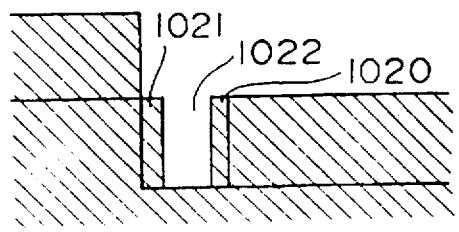
Figure 10G:
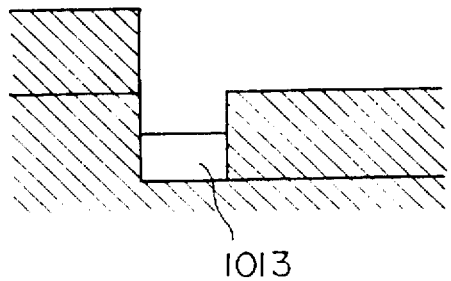

FIG. 8 shows an example of a semiconductor electronic-photo device produced by the method of the present invention. FIG. 8-a shows a field-effect transistor in which the structure produced on n-type silicon substrate 81 by the method of the present invention is used as channel area 82 of carrier. 83, 84, 85 and 86 indicate a source, a drain, a gate and an insulating layer, respectively. Operation of the transistor is conducted by controlling the current which passes through the channel area from the source to the drain. FIG. 8-b shows a photo device in which the structure produced by the method of the present invention is used as active layer 89 used for generating light. The light is generated by injecting into the active layer an electron from n-type silicon substrate 87 and a hole from p-type silicon thin layer 88 and recombining the electron and the hole. 80 indicates a metal electrode.

In the above explanation, gallium is used as the dopant, but boron, aluminum, indium or thallium may be used as a p-type dopant and phosphorus, arsenic, antimony or bismuth may be used as an n-type dopant.

EXAMPLE 7

Principle of another embodiment of the present invention is explained by FIGS. 9 and 10. First, explanation is made on the case where Si (111) clean surface is used as the surface of a semiconductor and Au is used as a metal. FIG. 9-a shows clean Si (111) surface 91 and there are steps of one bi-layer in height (3.13Å). When Au is vapor-deposited on the clean surface 91 with heating the surface at 300°–800° C., the vapor-deposited Au is gathered at the steps by surface diffusion to form reconstructed structures 92, 93 along the step edges (FIG. 9-b). The reconstructed structure is constituted of a plurality of adsorbed Au atomic rows which are along the step edges. The interval between the rows is 2 nm and the number of the rows, namely, the width of the reconstructed structure can be specified by the amount of the vapor deposition. The reconstructed structure formed along the step has the characteristics that it is lower than the terrace just above the step and is higher than the terrace just below. That is, the reconstructed structure 92 is lower than the terrace 94 which is originally the Si surface and higher than the terrace 95 which is originally the Si surface. Similarly, the reconstructed structure 93 is lower than the terrace 95 and higher than the terrace 96. When Si is vapor-deposited on this surface, the vapor-deposited Si does not produce crystal structure on the reconstructed structures 92, 93 of Au formed on the surface through the above-mentioned procedure and produces crystal structures 97, 98, 99 only on the terraces 94, 95, 96 having the uppermost surface of Si (FIG. 9-b) (FIG. 9-c). FIG. 9-c shows the structure where Si is vapor-deposited so that the crystal structure formed has a height of just one bi-layer. Thus, a microstructure having a linear Au in the groove can be formed. The width of this groove, namely, the width of the reconstructed structure of Au can be controlled at the level of nanometer depending on the amount of Au supplied as described above. Furthermore, since Au evaporates at a temperature lower than Si, it is also possible to remove only the Au present in the groove by heating to higher than about 800° C. Thereby, the groove 90 having a width of nanometer level can be easily formed (FIG. 9-d). That is, only Au can be removed without breaking the groove by desorbing Au at a temperature lower than the melting point of Si (about 1200° C.). Furthermore, a part of the metal thin layer can be locally removed by ion sputtering or by local heating using electron beam.

The principle will be explained in detail using FIG. 10. FIG. 10 is a sectional views, and step 1012 having a height of one bi-layer is present on an Si (111) surface substrate 1011 (FIG. 10-a). When Au is vapor-deposited on this surface 1011, the vapor-deposited Au diffuses on the surface to form a reconstructed structure at the position of the step (FIG. 10-b). This reconstructed structure comprises the Si atom layer 1013 which changes in arrangement due to the deposition of Au and the deposited Au atomic rows 1014. The deposited atomic rows 1014 are arranged along the step edge at an interval of 2 nm at a substrate temperature of 300°–800° C. The number of the deposited atomic rows can be controlled by controlling the amount of Au supplied. That is, the width of the reconstructed structure can be controlled at an integral multiple of 2 nm. When Si is vapor-deposited on this surface at 300°–800° C., since Si cannot be present stably in energy on the deposited Au atomic rows 1014, Si diffuses to the upper terrace (1015) or to the lower terrace (1016) (FIG. 10-c). As a result, the deposited Si does not form crystal structure on the deposited Au atomic rows 1014 and forms crystal structures 1017 and 1018 only on the portion where Si appears on the surface (FIG. 10-d). When this surface is heated at about 800°–1200° C., first the deposited Au atoms evaporate (1019) (FIG. 10-e) and Si present under the deposited Au atom rows transform to the structures 1020 and 1021 which are stable like other Si (FIG. 10-f). As a result, groove 1022 having a height of one bi-layer is formed. Furthermore, if the Au atomic rows are removed, for example, by sputtering at room temperature, the groove can be formed without breaking the arrangement of Si atoms under the Au atomic rows (FIG. 10-g). Si under the Au atomic rows has the structure differing from the original Si surface. That is, it has different electric characteristics and hence, micro processing can be performed not only structurally, but also electrically.

In the above example, the crystal is grown up to the height of only one bi-layer, but it is possible to increase the depth of the groove by further supplying the material. In this case, for some kinds of the crystals to be grown, crystal growth can also occur on the side face of the groove. For avoiding it, the material can be supplied at a low angle to the surface not to supply the material to the side face of the groove. Furthermore, when the surface energy at a plane perpendicular to the surface is high, the side face of the groove cannot necessarily be made perpendicular to the surface. In such case, the side face of the groove is formed at a face which is not perpendicular to the surface and which is stable in energy. In this case, the opening of the groove becomes wider depending on the depth of the groove, but since the bottom face is specified by a width in the order of nanometer (fluctuation of the width is 2 nm or less), the opening formed also does not have fluctuation in width (about 2 nm).

In the above example, explanation is made taking as an example the case of growing Si crystal which is the same as the substrate after the formation of the metal thin layer, but it is also possible to grow a crystal differing in the composition from the substrate by selecting the kind of the metal thin layer.

In the above example, the basic part of the present invention has been explained using Si (111) as the substrate surface and Au as the first element. As semiconductor materials for the substrate, mention may be made of not only the Si surface other than (111) plane, but also semiconductors of groups III-V such as Ge and those formed from Ga, Al, In, P, As, etc., for example, GaAs and semiconductors of groups II-VI such as ZnSe. As the first element, mention may be made of Ag, Cu, Ni, Pd, Pt, etc. as well as Au.

In the case of Au on the Si (111) surface, when Si is supplied after the formation of the Au thin layer, a plurality of Si atoms can meet with each other on the Au thin layer by diffusion, but crystal growth of Si does not occur on the thin layer. However, depending on the combination of the semiconductors and the metals or the temperature, there is the possibility that when atoms which constitute the crystal meet on the metal thin layer, a crystal structure is formed thereon. For avoiding it, the atoms which constitute the crystal structure may be prevented from meeting on the metal thin layer. For example, when the average retention time of the atoms on the metal thin layer is expressed by T and the vapor deposition rate is expressed by J, the covering rate is given by Jτ. When the smallest line width of the metal thin layer is expressed by R, in order that atoms can diffuse on the metal thin layer without meeting with other atoms, there is no problem if only one atom is present in the area $R^2$. That is, the atoms which constitute the crystal can be supplied at such a vapor deposition rate as giving a covering rate of $J\tau < (1/R^2)$, namely, a vapor deposition rate which satisfies $J < (1/(R^2\tau))$.

EXAMPLE 8

Figure 11A:
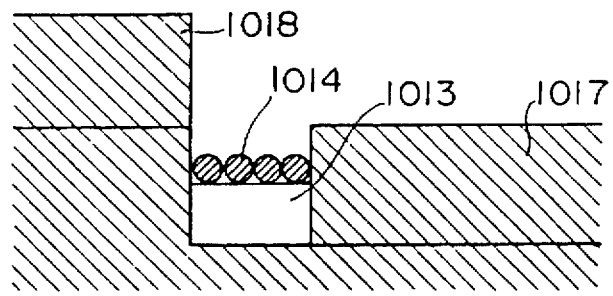
FIGS. 11a and 11b are schematic sectional views of an example where a wiring of one monolayer is made according to the present invention.
Figure 11B:
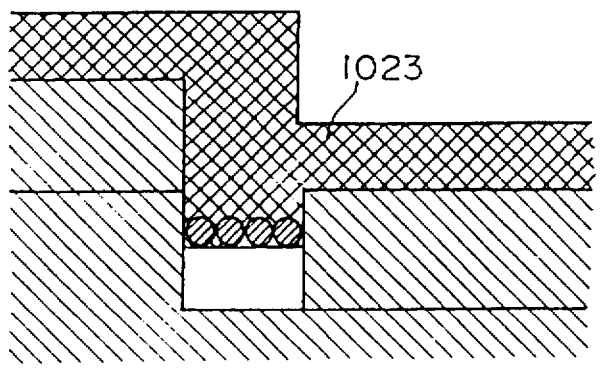

FIG. 11 shows one of application examples of the present invention. Atomic rows of deposited Au are formed in the portion of groove by the present invention (FIG. 11-a). This per se is effective as a fine Au wiring. Especially, since the atomic rows are formed in the groove, Au diffuses with difficulty and a stable line of a width of nanometer order can be formed. It is said that Au diffuses in Si with ease, but the thin layer structure body formed as above is very stable. If protective layer 1023 is further grown on the structure body (FIG. 11-b), this provides more preferable result. In this case, it is important that the protective film is grown at a temperature at which the crystal also grows on the Au thin layer or a material which shows crystal growth on the Au thin layer is used as the protective layer.

EXAMPLE 9

Figure 12A:
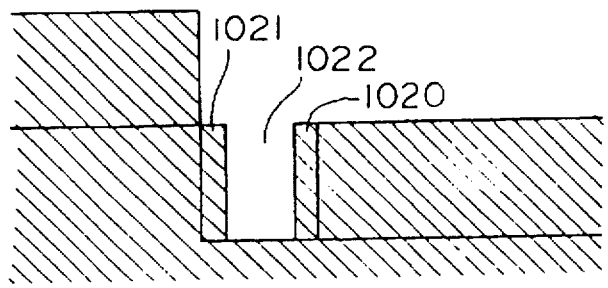
FIGS. 12a–12c are schematic sectional views of an example where a metal wiring is made according to the present invention.
Figure 12B:
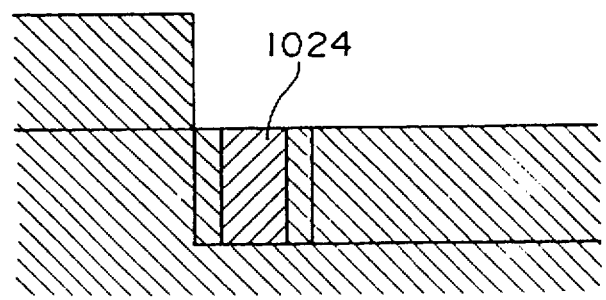
Figure 12C:
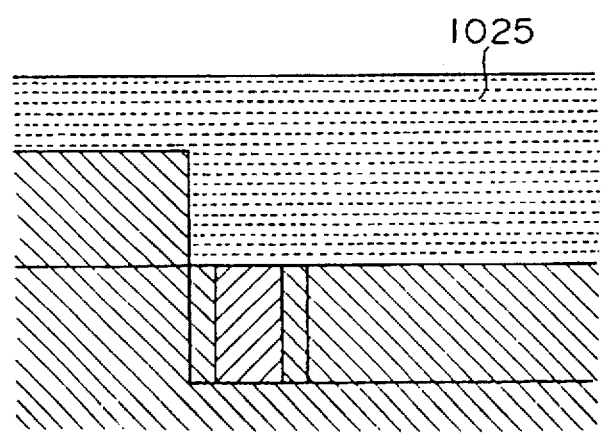
Figure 13A:
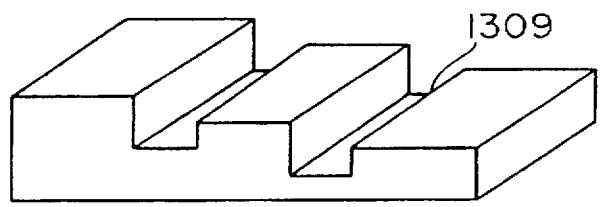
FIGS. 13a–13d are diagrams which explains a process for production of the micro-structure body according to the present invention.
Figure 13B:
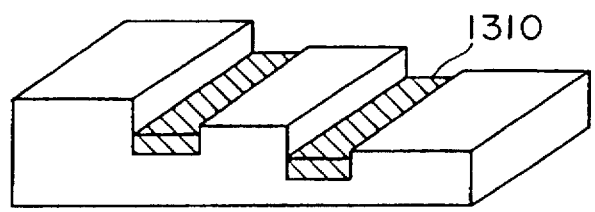
Figure 13C:
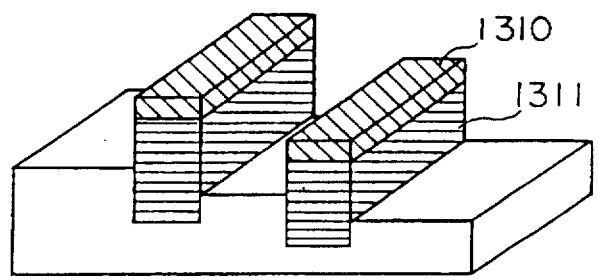
Figure 13D:
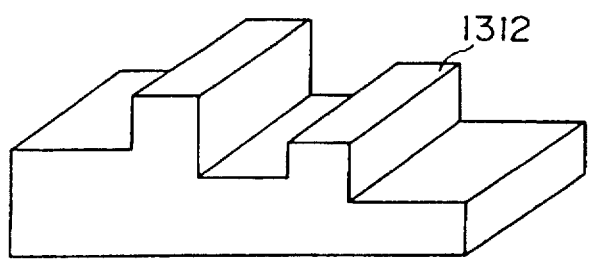

FIG. 12 shows another application example of the present invention. In FIG. 12-a, groove 1022 having a height of one bi-layer is formed by the present invention. A linear structure of nanometer level can be formed by supplying material 1024 different from the metal or the substrate into the groove (FIG. 12-b). The supplying method includes a method of supplying the material locally to the groove by focused ion beam or the like and a method of supplying the material to the whole surface and gathering the material in the groove by diffusion. In either case, the material is supplied to the groove and so can be present stably. Even if the material is supplied overflowing the groove, only the overflowed material can be easily removed by sputtering, etc. The material to be supplied is not limited to metals and can be, for example, organic materials or the like. For example, the metals include Ag, Cu, Ni, Pd, Pt and others and the organic materials include copper phthalocyanine, fullerene and others. Since width of the groove can be specified at a level of nanometer, for example, when a molecular crystal such as the above electrically conductive organic material is supplied, the molecules can be easily aligned by forming a groove of width in correspondence to the size of the molecules. It is needless to say that stability increases by providing a protective layer 1025 on the thus formed structure. The material of the protective layer 1025 may be or may not be the same as the substrate. For example, it may be a film of polyimide, a nitride or the like.

EXAMPLE 10

According to the present invention, crystal growth can be selectively carried out in the area of 10 nm or less (1 nm or less in fluctuation). The method is explained in detail using FIG. 13. By the method explained in Example 7, a groove 1309 of a width of nanometer level is formed on the surface of a semiconductor (FIG. 13-a). Metal 1310 which promotes growth of crystal is supplied in this groove (FIG. 13-b). Thereafter, when a material which is to constitute the crystal is supplied on the surface, the crystal selectively grows in the area to which the metal has been supplied. It is known that in this case, the metal 1310 which promotes the growth is always present above the crystal 1311 (FIG. 13-c). The combination of the metal and the semiconductor includes, for example, Au, Pd, Pt, Ni, Cu, Ag or the like on Si. It is known that after supplying the metal, the substrate is heated to form an alloy and a semiconductor crystal selectively grows by gas phase growth. The same can be attained by using a semiconductor such as GaAs. After growing the crystal in this way, when the metal is removed by the method such as evaporation, a structure of a width of nanometer order can be formed as shown in FIG. 13-d. By using the present invention, since the metal which promotes the growth can be arranged at a level of nanometer at high accuracy, the grown crystal also is little in fluctuation of line width of a nanometer level.

EXAMPLE 11

In Examples 7, 8 and 9, the microstructure is formed at the position of steps. However, it is clear that microstructures of optional shapes can be formed by forming island structures by supplying the same material as of the substrate to the surface of the substrate or forming steps of optional shapes by changing the shape of the steps. As methods for locally supplying the material, there can be considered various methods such as vapor deposition using a mask, dissociation adsorption of material using electron beam, a method of using a focused ion beam, and a method of probe microscopes such as scanning tunneling microscope. It is not necessarily easy to conduct processing of 10 nm by these methods, but it is the characteristic of the present invention that the means to supply the material is not necessarily needed to have a resolution of nanometer level. A method of forming a micro-structure body having an optional shape will be explained using FIG. 14 and FIG. 15.

Figure 14A:
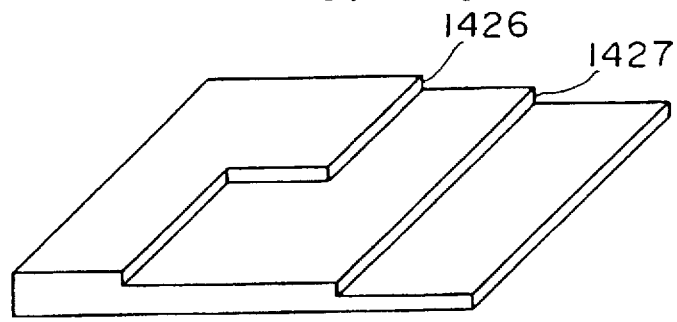
FIGS. 14a–14c are diagrams which explains an example of production of a wiring pattern along the steps according to the present invention.
Figure 14B:
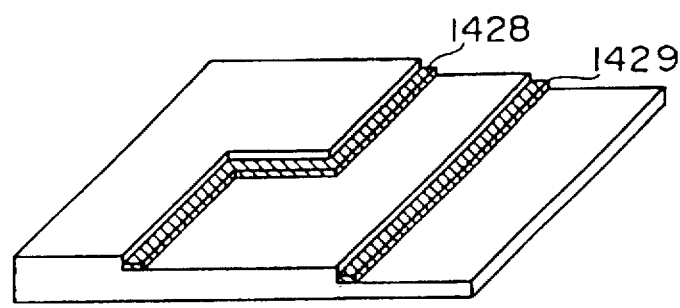
Figure 14C:
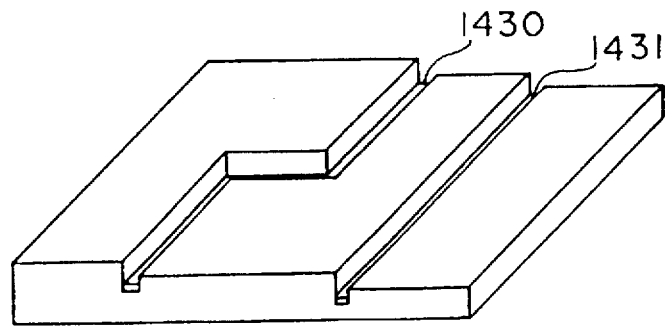
Figure 15A:
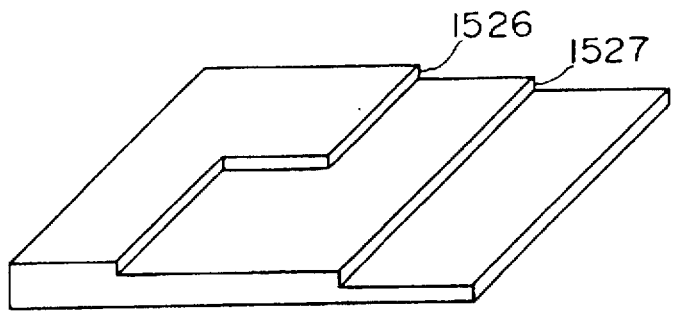
FIGS. 15a–15d are schematic views which shows another example of production of a wiring pattern according to the present invention.
Figure 15B:
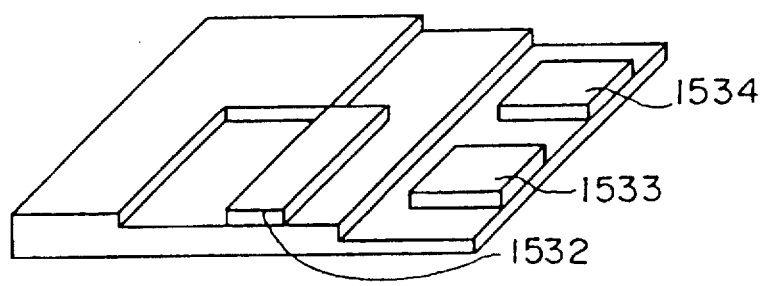
Figure 15C:
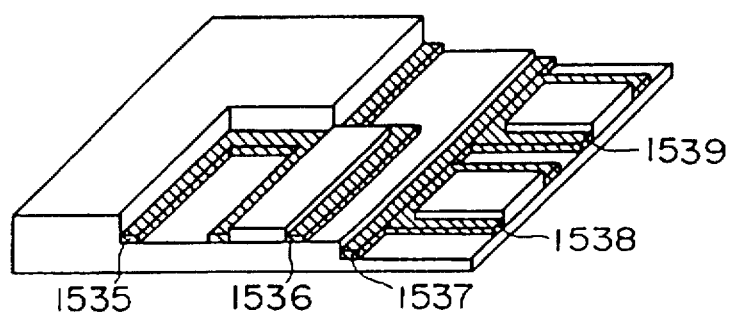
Figure 15D:
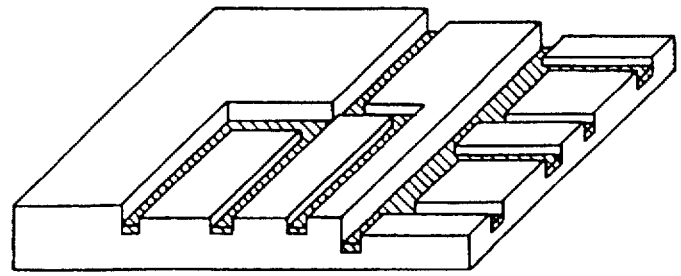

FIG. 14 shows a method of forming microstructure bodies along steps 1426 and 1427 (FIG. 14-a) which are originally present on the surface of the substrate. First, fine lines 1428 and 1429 of a metal are formed by supplying the metal onto the surface (FIG. 14-b). Then, a crystal of semiconductor is grown so that the crystal does not grow on the metal thin layers (FIG. 14-c), whereby fine grooves 1430 and 1431 of 10 nm or less are formed. In this way, by using the present invention, fine lines of the metal having a width of nanometer level can be formed in the groove. However, the shape thereof depends on the shape of the original step as is clear from the comparison of FIG. 14-a with FIG. 14-c. Therefore, if the material is supplied onto the surface and steps of optional shapes are formed, fine grooves having optional structures can be formed. Specific explanation will be made using FIG. 15.

FIG. 15-a is the same as FIG. 14-a. Island structures 1532, 1533 and 1534 are formed by supplying Si onto the surface (FIG. 15-b). In this case, the size of the islands is not needed to be at a level of nanometer and they may be formed by the conventional methods of forming micro-structures. When Au is supplied onto this surface, Au forms the reconstructed structure along not only the originally existing steps 1526 and 1527, but also the new steps produced by forming the island structure. As a result, the metal fine lines 1535, 1536, 1537, 1538 and 1539 are formed (FIG. 15-c). Width of the fine lines can be controlled at a level of nanometer. It is the characteristic of the present invention that even if the shape per se of the island formed by Si supplied does not have a width of nanometer level, it is possible to form the metal fine lines having a width of nanometer level along the steps. Accordingly, metal lines of optional shapes can be formed by making optional the shape of the island. Furthermore, when Si is supplied onto this surface, microstructures having metal fine lines in the grooves can be formed (FIG. 15-d).

Figure 16:
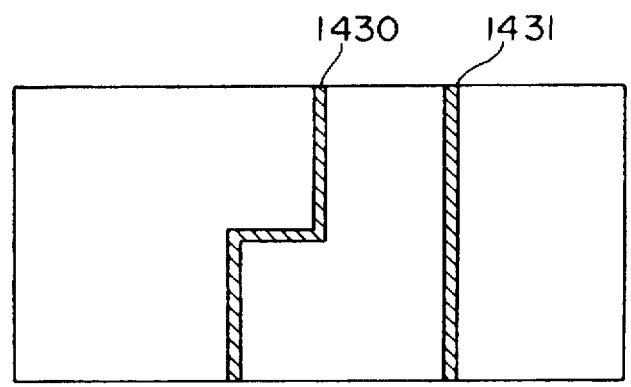
FIG. 16 is a diagram of the wiring pattern of FIGS. 14a–14c looked at from above.
Figure 17:
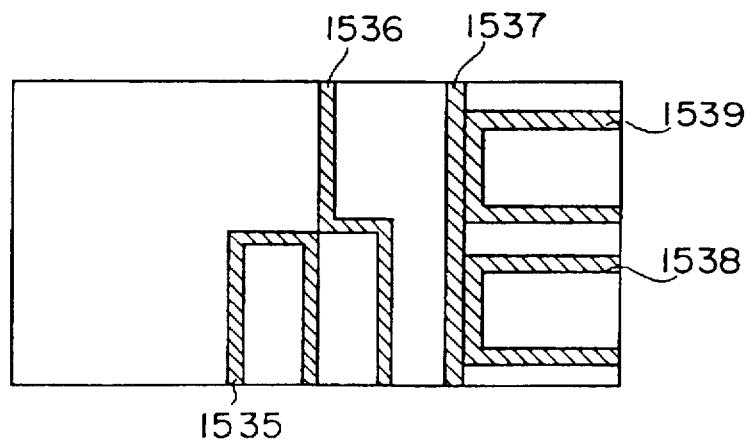
FIG. 17 is a diagram of the wiring pattern of FIGS. 15a–15d looked at from above.

In FIG. 15, steps of optional shapes are formed by supplying Si, but the steps of optional shapes may be formed by removing Si from the surface to form grooves. It is the same as in the case of forming the island structures that these grooves for forming the microstructure bodies are not necessarily needed to have a width of nanometer level. FIG. 16 is a top view of FIG. 14-c and in FIG. 16, metal fine lines 1430 and 1431 are formed in the grooves in conformity with the shapes of the original steps. FIG. 17 is a top view of FIG. 15-d and it can be seen that metal fine lines 1535, 1536, 1537, 1538 and 1539 of optional structures are formed.

EXAMPLE 12

Figure 18A:
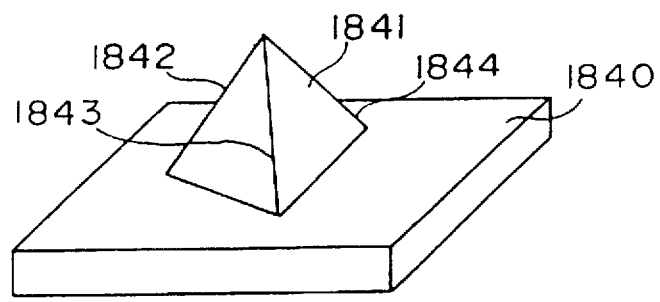
FIGS. 18a–18c are diagrams which show an example of three-dimensional production of the wiring pattern according to the present invention.
Figure 18B:
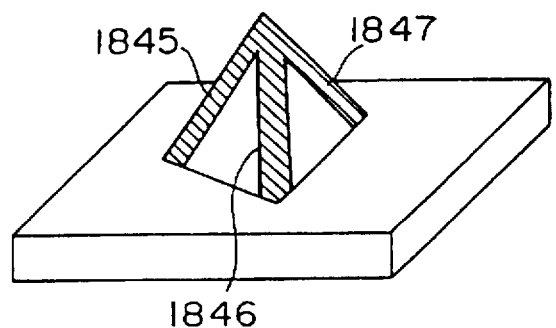
Figure 18C:
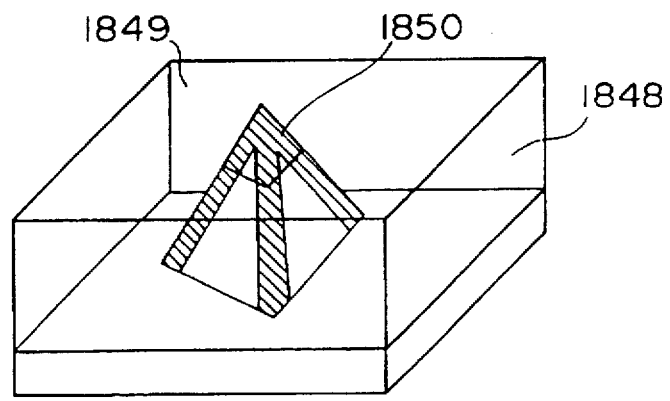

Furthermore, according to the present invention, it is easy to carry out the micro processing not only in plane, but also three-dimensionally. The fundamental processing method will be explained using FIG. 18. The three-dimensional island structure 1841 is formed by supplying Si onto the substrate 1840 (FIG. 15-a). For simplification, a triangular pyramid is used here, but the shape can be adapted to the desired shape. In this case, the three ridges 1842, 1843 and 1844 function as a kind of step. Accordingly, when Au is supplied onto the surface, the supplied Au forms reconstructed structures 1845, 1846 and 1847 along the ridges. These reconstructed structures cross at the apex. On this surface is supplied semiconductor 1848 at 300° C. or lower, whereby a new semiconductor surface 1849 having microstructure inside the crystal is formed and this surface is connected with the lower structure by the metal fine lines 1845, 1846 and 1847. By connecting the structure on the new surface 1849 to the portion 1850 appearing on the surface, the portion can be electrically connected to the lower structure. By subjecting this surface to further micro processing, the three-dimensional micro processing can be easily performed. In FIG. 18, regarding the direction perpendicular to the surface, the microstructure of the present invention is used for only the connection, but it is clear that according to the present invention, complicated micro processing can also be carried out in the direction perpendicular to the surface by forming a plurality of island structures having various shapes.

In the above example, explanation has been made on the assumption that the supply of the metal is carried out by vapor deposition, but if the amount of the metal supplied is locally controlled by focused ion beam vapor deposition method or the like, width of the metal fine lines or width of the grooves can be locally changed.

EXAMPLE 13

Figure 19:
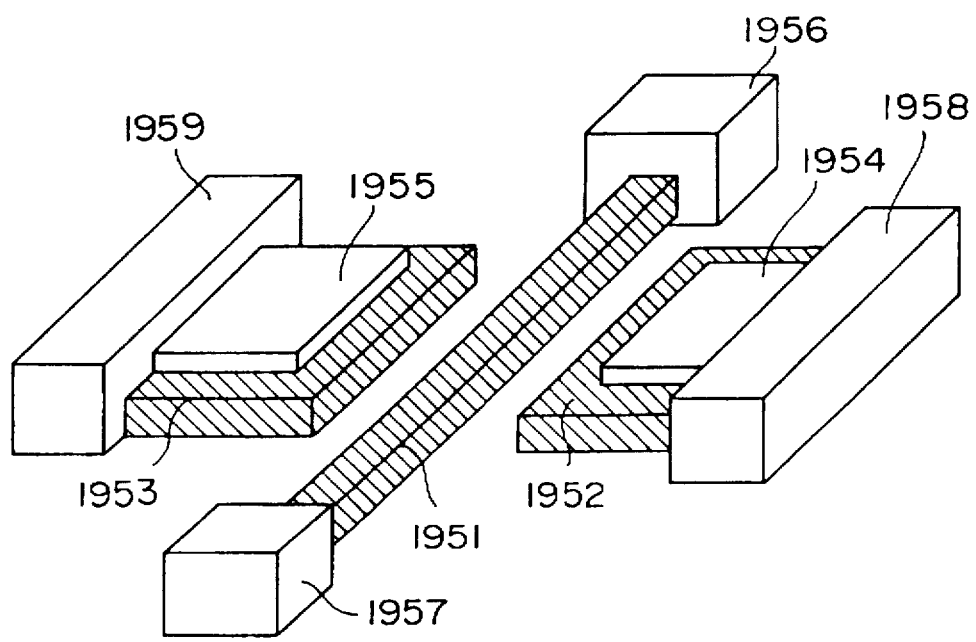
FIG. 19 is a diagram which shows another example of the wiring pattern according to the present invention.

FIG. 19 shows a part of an electronic circuit made by the present invention. Metal fine line 1951 is formed by the present invention. Furthermore, metal fine lines 1952 and 1953 are also formed around island structures 1954 and 1955. These are connected to electrodes 1958 and 1959, respectively and a voltage is applied to the two metal lines by applying a voltage to the electrodes. Both ends of the metal fine line 1951 are connected to the two metal terminals 1956 and 1957 and a current can be passed between the terminals. In this case, the quantity of current flowing through the metal fine line 1951 can be controlled by the voltage applied to the two electrodes 1958 and 1959, namely, the voltage applied to the two metal fine lines 1952 and 1953. The characteristic made possible by the present invention is that a potential or an electric field can be locally applied to the metal fine line 1951 through the metal fine lines 1952 and 1953 of a nanometer order, and thereby it becomes possible to provide a potential barrier in the metal fine lines. Moreover, the metal fine line 1951 through which current is passed can be processed to the order of nanometer and as a result, the current passed can be allowed to have a discrete value depending upon the voltage applied by the quantum size effect. In the example, both ends of the metal fine lines 1952 and 1953 are connected to one metal terminal, respectively, but it is also possible to control the quantity and the direction of the current which flows through the metal fine line 1951 by the quantity and the direction of the current which passes through the metal fine lines 1952 and 1953 by connecting the both ends to different terminals.

Of course, there is no need to form the whole device only by the microstructure using the present invention and when only the part which conducts a key operation is formed by the present invention, for example, a device having a new function such as quantum effect device can be easily produced.

When metal fine lines such as electrodes are formed on the surface of a semiconductor by the present invention, reliability enhances by using an intrinsic semiconductor of less impurities as a substrate.

EXAMPLE 14

Figure 20A:
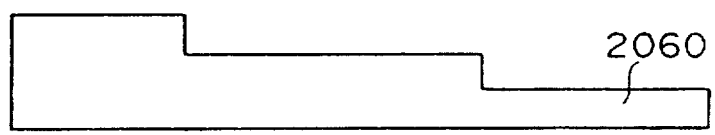
FIGS. 20a–20c are schematic sectional views which show an example of production of a micro-structure body utilizing a metal which promotes crystal growth according to the present invention.
Figure 20B:
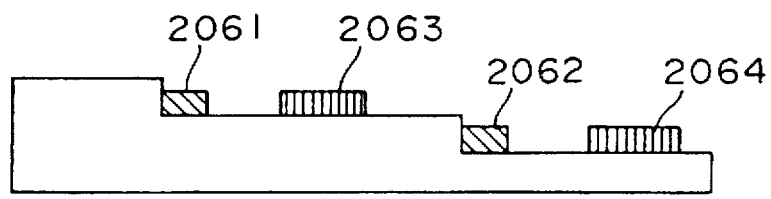
Figure 20C:
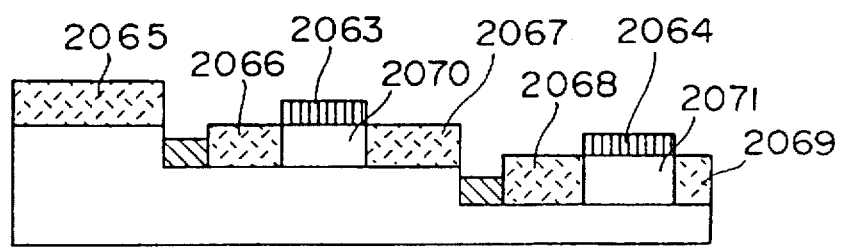

Next, an example of micro processing carried out by combination with a metal which promotes the growth will be explained using FIG. 20. Ga or the like is known as a metal which promotes the growth of semiconductor. FIG. 20 is a sectional view and steps are present on the surface 2060 of the semiconductor substrate. On the surface are grown the metal thin layers 2061 and 2062 formed by the present invention (FIG. 20-b). Furthermore, on another places are formed metal thin layers 2063 and 2064 which promote the growth of semiconductor. When on this surface is supplied the semiconductor with controlling the vapor deposition rate and the substrate temperature, the structure as shown in FIG. 20-c can be formed. That is, no semiconductor crystal grows on the metal thin layers 2061 and 2062. The metal thin layers 2063 and 2064 promote growth of the semiconductor crystal to form thereunder semiconductors 2070 and 2071 of good crystallinity. Since the areas which are not covered with the metal thin layer are not sufficient in growing conditions, semiconductors 2065, 2066, 2067, 2068 and 2069 of poor crystallinity (inferior electric conductivity) are formed. In this way, by combining the present invention with a metal which promotes the growth of semiconductor crystal, micro processing including superiority or inferiority of crystallinity in addition to the actual ruggedness. It is clear that use of only the conventional metal which promotes the growth cannot form ruggedness. Moreover, the metal thin layers 2061, 2062, 2063 and 2064 can be removed without rupturing the structure of the semiconductor.

EXAMPLE 15

Figure 21A:
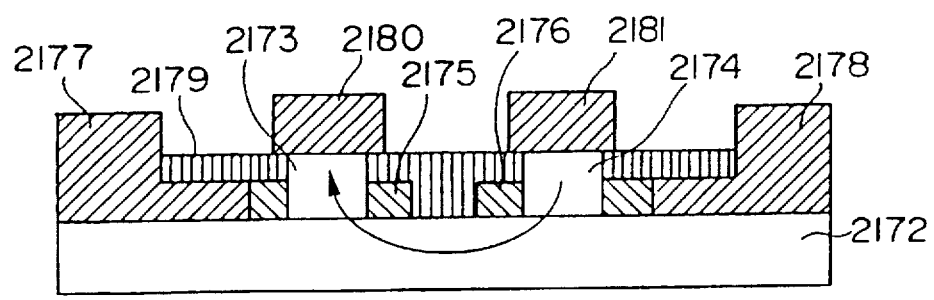
FIGS. 21a and 21b include a schematic sectional view and a schematic illustration which show one example of an electronic circuit comprising the microstructure body according to the present invention.
Figure 21B:
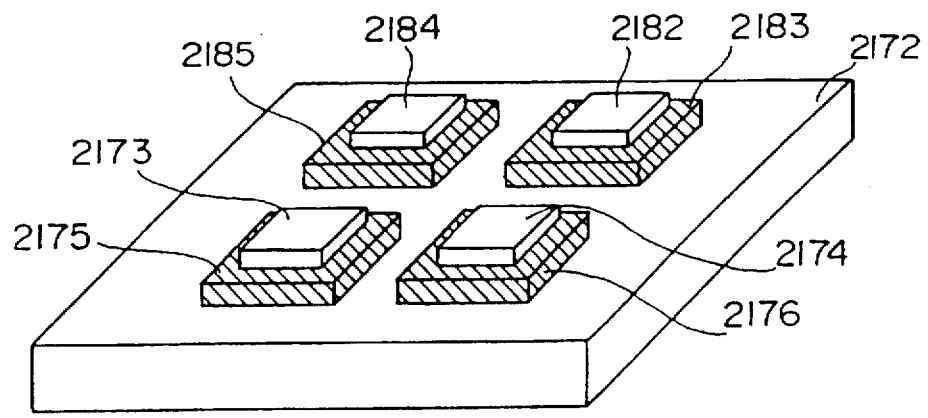

FIG. 21 shows the main parts of an electronic circuit formed by combination with the metal which promotes the growth. FIG. 21-a is a sectional view which shows that semiconductors 2173 and 2174 of good crystallinity are formed on the substrate 2172. These are surrounded by the metal fine lines 2175 and 2176 formed by the present invention. To these metal fine lines is applied a voltage by the metal electrodes 2177 and 2178. According to the present invention, since this electronic circuit can be formed in a minute area, for example, when a negative voltage is applied to the metal terminal 2180 and a positive voltage is applied to the metal terminal 2181, a current can be flowed between the terminals through the substrate 2172 (see the arrow). The quantity of this current can be controlled by the voltage applied to the metal fine lines 2175 and 2176. For example, it becomes possible to use the current utilizing tunnel effect. This circuit is further covered with protective layer 2179. In FIG. 21-b which shows an oblique view, the metal terminals and the protective layer are omitted. Conventionally, an electronic circuit is formed by the combination of on-off between two terminals, but according to the present invention, four terminals can be formed in a minute area as shown in FIG. 21-b and it becomes possible to flow a current through optional four terminals by controlling the voltage applied to the metal fine lines 2175, 2176, 2183 and 2185. In this example, too, the metal electrodes 2177 and 2178 may be formed by conventional methods and only the main parts may be formed by the present invention.

EXAMPLE 16

Figure 22A:
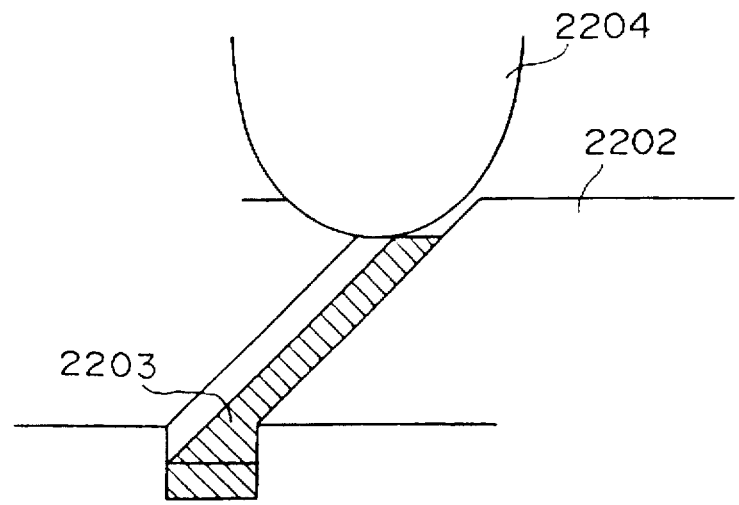
FIGS. 22a–22c are diagrams which show another example of the microstructure body and a method for producing the same according to the present invention.
Figure 22B:
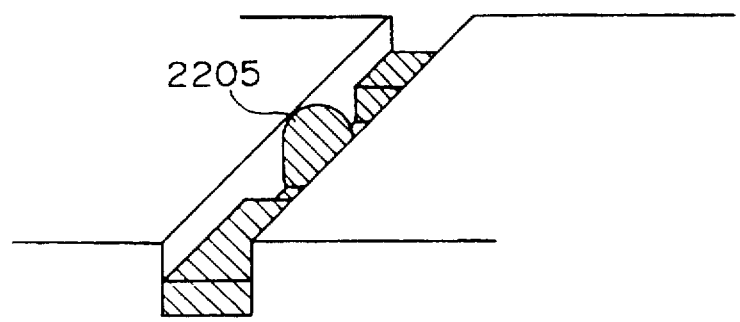
Figure 22C:
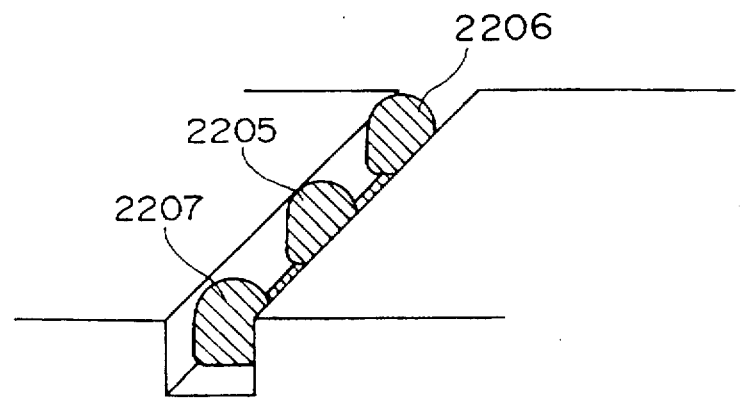
Figure 23A:
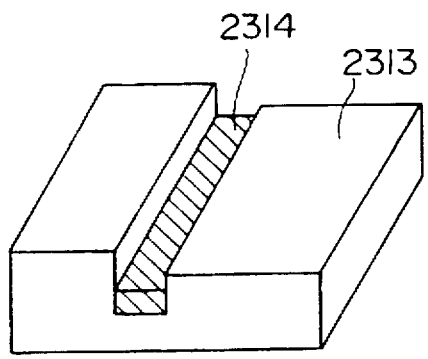
FIGS. 23a–23e are diagrams which show an example of forming a multilayer wiring pattern according to the present invention.
Figure 23B:
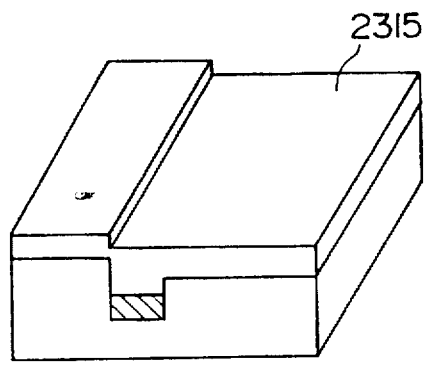
Figure 23C:
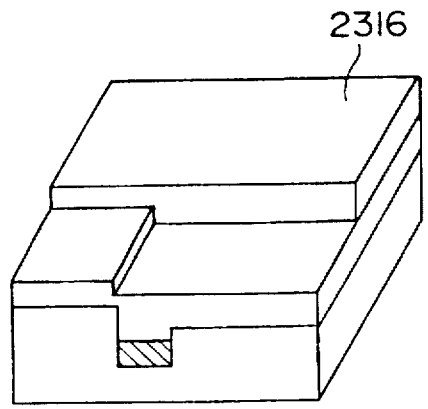
Figure 23D:
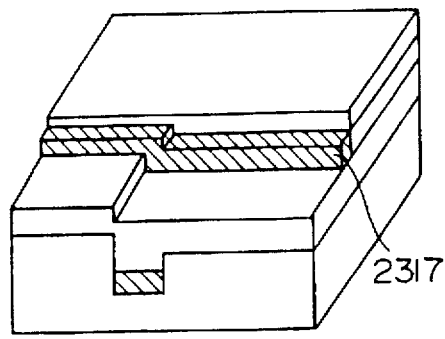
Figure 23E:
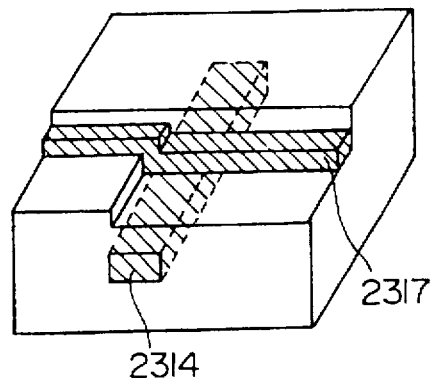

According to the present invention, a dot row of metal cluster which is a base of a quantum effect device can be easily formed. The method will be explained using FIG. 22. A metal fine line 2203 is formed by the present invention in the groove on the substrate surface 2202 (FIG. 22-a). The metal cluster can be formed by locally heating the metal fine line. FIG. 22 shows a method of using a probe microscope. The probe 2204 of microscope is positioned above the metal fine line 2203 and a current larger than that of normal microscopic mode is passed between the probe and the metal fine line, whereby the metal fine line is locally heated and a part of the metal fine line is molten to form the metal cluster 2205 (FIG. 22-b). By repeating this procedure, a row comprising a plurality of metal clusters 2205, 2206 and 2207 can be formed (FIG. 22-c). It is well known that local heating of a metal thin layer can produce clusters. The characteristic obtained by using the present invention is these metal clusters can be aligned in a row. Furthermore, according to the present invention, the clusters are formed in a groove and are very stable. The size of the clusters is determined by the width of the metal fine line 2203 and the interval between the metal clusters formed. The method of local heating includes a method of using electron beam as well as a method of using a probe microscope.

In the above example, the clusters are formed by melting the metal fine line, but the dot row can also be formed by removing a group of several metal atoms arranged in the row to form a row of metal atoms aligned at an interval.

In the above Examples 1–10, explanations have been made on the method for forming microstructures according to the present invention using an Si (111) clean surface as the semiconductor surface and Au as the metal and on the electronic devices made by the said method. The most important point of the present invention is the finding that there are combinations of compositions of the respective metal and semiconductor with the structure where no crystal grows on the metal thin layer. By using this phenomenon, micro processing of semiconductors can be easily performed at a level of nanometer. Only the examples in which steps are used have been explained above, but it is also possible to form the metal thin film not only at the step edge, but also on terrace by locally supplying the metal with controlling the substrate temperature.

EXAMPLE 17

According to the present invention, for example, multilayer wiring of a metal can be easily carried out. Explanation will be made using FIG. 23. Metal fine line 2314 is formed on the semiconductor substrate surface 2313 by the present invention (FIG. 23-a). The metal which constitutes the fine line 2314 is different from the metal which inhibits the growth of the semiconductor crystal according to the method explained hereabove. On this surface is growth semiconductor crystal 2315 (FIG. 23-b). In this case, for the above-mentioned reason, the crystal also grows on the metal 23-14. Furthermore, semiconductor crystal 2316 is locally grown (FIG. 23-c). On the surface is formed metal fine line 2317 by the present invention (FIG. 23-d). In this way, a multilayer wiring can be easily carried out using the metal fine lines. FIG. 23-e is a perspective view. It can be clearly seen that two metal lines 2314 and 2317 are formed. For multilayer wiring, a fresh crystal is growth on the metal fine lines. In this case, it is important that the crystal growth is carried out under the conditions at which the crystal also grows on the metal. For this purpose, the metal which constitutes the metal fine lines may be replaced with a metal which does not inhibit the growth of crystal by the method explained in the above examples or the temperature may be lowered to cause growth of crystal also on the metal fine lines. The greatest characteristic obtained by using the present invention is that multilayer wiring can be performed by metal fine lines having a width of nanometer order and less in fluctuation of the line width.

EXAMPLE 18

Figure 24:
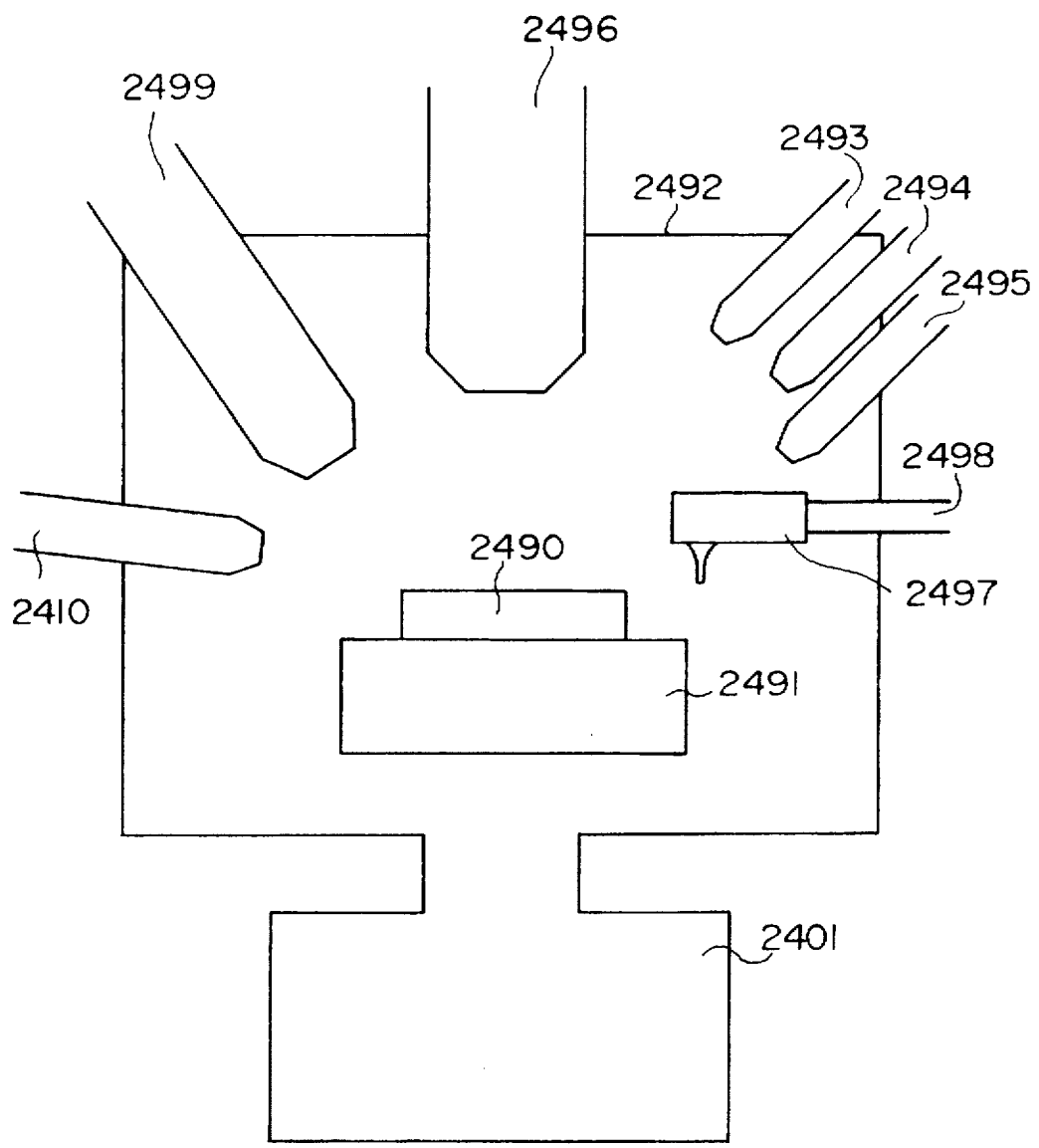
FIG. 24 is a diagram which shows an example of an apparatus used for production of the microstructure body according to the present invention.

FIG. 24 shows an example of an apparatus used for carrying out the formation of microstructure bodies according to the present invention. The semiconductor substrate 2490 is placed on sample holder 2491 the temperature of which can be controlled. The semiconductor substrate 2490 and the sample holder 2491 are placed in a vacuum chamber 2492. In the vacuum chamber 2492 the following means are provided to form the microstructures. Material supply means 2493, 2494 and 2495 are for supplying material onto the surface of the substrate 2490 and at least one of them is for supplying metal. It is a characteristic that on the thin layer of the metal formed on the substrate surface, crystals of the materials supplied from other material supply means do not grow. The material supply means may be any of vapor deposition method, gas introduction method and other methods. Furthermore, a scanning electron microscope 2496 and a scanning probe microscope 2497 are provided for monitoring the micro processing. The scanning probe microscope can be positioned above the surface of the substrate 2490 or can be kept away from the surface of the substrate by moving mechanism 2498 so that it does not hinder the supply of the material. A focused ion beam source 2499 is provided in order to supply the material locally or to carry out processing by a sputter. In addition, a sputtering apparatus 2410 which uses an inert gas is also provided. The vacuum chamber 2492 is evacuated by vacuum pump 2401.

In the above example, a plurality of observation means and sputtering means are provided. All of them are not necessarily needed to attain the present invention. At least the sample, the sample holder the temperature of which can be controlled and a plurality of the material supply means are sufficient for attaining the present invention. The above example is on the assumption that the microstructure is formed in a vacuum, but a certain atmosphere gas can be used.

Industrial Applicability

The present invention is effective for forming on a substrate a microstructure body having a size of 10 nm or less which is necessary to operate quantum effect devices such as single electron transistor, electronic wave interference device and light interference device at room temperature.

We claim:

1. A method for making a microstructure body on a substrate which comprises forming a layer of a first element, thinner than one monolayer, by arranging the first element at a rugged position of the substrate, then forming a layer of at least one second element on a part of the substrate on which the layer of the first element is not formed, and not on the layer of the first element, wherein the first element is selected from the group consisting of gold, silver, copper, nickel, palladium, platinum and elements of group IV and the second element is selected from the group consisting of elements of group III, elements of group IV and elements of group V.

2. A method according to claim 1, wherein the substrate comprises a semiconductor.

3. A method according to claim 1, wherein the substrate has a crystalline structure.

4. A method according to claim 2, wherein the semiconductor is a single element semiconductor, a III–V group compound semiconductor or a II–VI group compound semiconductor.

5. A method according to claim 1, wherein the rugged position comprises a surface state which the crystal constituting the substrate inherently possesses.

6. A method according to claim 5, wherein the surface state is in the form of steps or islands and height of the steps or islands is at most 10 atoms.

7. A method according to claim 5, wherein the surface state comprises lattice defect.

8. A method according to claim 5, wherein the surface state is dent portions of optional shapes formed by removing atoms of the substrate surface by a scanning tunneling microscope or projected portions are formed by stacking atoms on the substrate surface.

9. A method according to claim 6, wherein the rugged position is an edge line of terrace just under the steps.

10. A method according to claim 6, wherein the rugged position is an intersecting line of the islands and the surface of the substrate.

11. A method according to claim 1, wherein the rugged position is on an atomic layer.

12. A method according to claim 1, wherein the microstructure body is a fine line in the order of nanometer.

13. A method according to claim 1, wherein the microstructure body is a fine groove in the order of nanometer.

14. A method according to claim 1, wherein the microstructure body constitutes a circuit pattern.

15. A method according to claim 1, wherein the forming of the layer of the at least one second element is carried out by selecting at least one combination from combination of temperature, combination of atomic arrangement and combination of the kinds of elements.

16. A method according to claim 1, wherein the deposition is carried out by chemical vapor deposition method (CVD), molecular beam epitaxy method (MBE) or a method of using a probe of scanning tunneling microscope or combination of these methods.

17. A quantum interference device comprising the microstructure body made by the method of claim 1.

18. A method according to claim 4, wherein said semiconductor is a single element semiconductor, and is selected from the group consisting of silicon, germanium, selenium and tellurium.

19. A method according to claim 4, wherein said semiconductor is a III–V group compound semiconductor, and is selected from the group consisting of gallium-arsenic and indium-antimony.

20. A method according to claim 4, wherein said semiconductor is a II–VI group compound semiconductor, and is selected from the group consisting of cadmium sulfide and zinc oxide.

21. A method according to claim 1, including the further step of removing said layer of the first element, so as to form a groove where said layer of the first element had been.

22. A method according to claim 1, wherein the rugged position of the substrate is a position of the substrate stable in energy formed by ruggedness of a rugged pattern on the order of atomic size on the substrate.

23. A method for making a microstructure body on a substrate which comprises forming a layer of a first element, thinner than one monolayer, by arranging the first element at a position of the substrate stable in energy formed by ruggedness of rugged pattern in the order of atomic size present on the substrate, and then depositing at least one second element on a part of the substrate on which the layer of the first element is not formed, wherein the substrate comprises silicon, the first element is gold and the second element is silicon, and face (111) of the substrate is cleaned to obtain a substrate surface having a step having a height of one monolayer, gold is vapor deposited on the surface of the substrate kept at 300°–800° C. to carry out rearrangement of gold atoms along an edge line of a terrace just under the step, thereby to form a layer thinner than one monolayer which has a width of nanometer order and furthermore, silicon of the second element is vapor deposited to form a silicon layer on the layer of silicon which is not covered with the thin layer of gold.

24. A method for making a microstructure body on a substrate which comprises forming a layer of a first element, thinner than one monolayer, by arranging the first element at a position of the substrate stable in energy formed by ruggedness of rugged pattern in the order of atomic size present on the substrate, and then depositing at least one second element on a part of the substrate on which the layer of the first element is not formed, wherein the substrate comprises silicon, the first element is gold and the second element is silicon, and the surface of the substrate is cleaned to obtain a substrate surface having a step having a height of single atom, gold is vapor deposited on the surface of the substrate kept at 300°–800° C. to carry out rearrangement of gold atoms along an edge line of a terrace just under the step, thereby to form a layer thinner than one monolayer which has a width of nanometer order, furthermore, silicon of the second element is vapor deposited to grow and form a si-silicon layer on the layer of silicon which is not covered with the thin layer of gold and then, the substrate is heated at 800°–1200° C. to remove the gold by evaporation thereby to form a groove.

25. A method for making a microstructure body on a substrate which comprises forming a layer of a first element, thinner than one monolayer, by arranging the first element at a position of the substrate stable in energy formed by ruggedness of rugged pattern in the order of atomic size present on the substrate, and then depositing at least one second element on a part of the substrate on which the layer of the first element is not formed, wherein the substrate comprises silicon, the first element is germanium and the second element is gallium, and the surface of the substrate is cleaned to obtain a substrate surface having a step of single atomic layer in height, germanium is vapor deposited on the surface of the substrate to carry out rearrangement of germanium atoms along an edge line of a terrace just under the step, thereby to form a germanium layer of thinner than one monolayer which has a width of nanometer order and furthermore, gallium of the second element is vapor deposited at a substrate temperature higher than the temperature at which gallium on the germanium layer is released and lower than the temperature at which gallium on the silicon substrate is released, thereby to form a germanium layer and a gallium layer on the silicon substrate.

26. A method for making a microstructure body on a substrate which comprises forming a layer of a first element, thinner than one monolayer, by arranging the first element at a position of the substrate stable in energy formed by ruggedness of rugged pattern in the order of atomic size present on the substrate, and then depositing at least one second element on a part of the substrate on which the layer of the first element is not formed, wherein the substrate comprises silicon, the first element is germanium and the second element is gallium, and the surface of the substrate is cleaned to obtain a substrate surface having a step of single atomic layer in height, germanium is vapor deposited on the surface of the substrate to carry out rearrangement of germanium atoms along an edge line of a terrace just under the step, thereby to form a germanium layer thinner than one monolayer which has a width of nanometer order, furthermore, gallium of the second element is vapor deposited at a substrate temperature higher than the temperature at which gallium on the germanium layer is released and lower than the temperature at which gallium on the silicon substrate is released, thereby to form a germanium layer and a gallium layer on the silicon substrate, and then, silicon atom is deposited on both the layers to provide a mixed crystal thin layer of silicon and germanium, a silicon layer doped with gallium and a silicon thin layer having thereon a gallium layer formed by surface segregation.

27. A method for making a microstructure body on a substrate which comprises forming a layer of a first element thinner than one monolayer, by arranging the first element at a position of the substrate stable in energy formed by ruggedness of rugged pattern in the order of atomic size present on the substrate, and then depositing at least one second element on a part of the substrate on which the layer of the first element is not formed, wherein a rectangular layer thinner than one monolayer of germanium of the first element is formed utilizing lattice defect on the silicon substrate, furthermore, gallium of the second element is vapor deposited at a substrate temperature higher than the temperature at which gallium on the germanium layer is released and lower than the temperature at which gallium on the silicon substrate is released, thereby to form a germanium layer and a gallium layer on the silicon substrate, then, silicon atom is deposited on both the layers to provide a box-shaped mixed crystal thin layer of silicon and germanium, a silicon layer doped with gallium and a silicon thin layer having thereon a gallium layer formed by surface segregation, successively the gallium layer is removed by evaporation, silicon is grown by step flow growth on the silicon layer doped with gallium to form a silicon thin layer, further successively a gallium layer of one monolayer or less is formed on the whole surface of both the mixed crystal thin layer of silicon and germanium and the silicon thin layer and then silicon is grown by two-dimensional nuclear growth to provide a silicon thin layer having a gallium layer thereon formed by surface segregation.

28. A method for making a microstructure body on a substrate which comprises forming a layer of a first element, thinner than one monolayer, by arranging the first element at a position of the substrate stable in energy formed by ruggedness of rugged pattern in the order of atomic size present on the substrate, then depositing at least one second element on a part of the substrate on which the layer of the first element is not formed, and then covering the substrate and the microstructure body with a protective layer.

29. A method for making a microstructure body on a substrate which comprises forming a layer of a first element, thinner than one monolayer, by arranging the first element at a position of the substrate stable in energy formed by ruggedness of rugged pattern in the order of atomic size present on the substrate, and then depositing at least one second element on a part of the substrate on which the layer of the first element is not formed, wherein a rectangular groove is formed on the surface of the silicon substrate by removing surface atoms by a probe of a scanning tunneling microscope, a thin layer of germanium of the first element is formed in the groove, furthermore, gallium of the second element is vapor deposited at a substrate temperature higher than the temperature at which gallium on the germanium layer is released and lower than the temperature at which gallium on the silicon substrate is released, thereby to form a gallium layer selectively on the silicon substrate, then, silicon atom is deposited on both the layers to provide a box-shaped mixed crystal thin layer of silicon and germanium, a silicon layer doped with gallium and a silicon thin layer having thereon a gallium layer formed by surface segregation, successively the gallium layer is removed by evaporation, silicon is grown by step flow growth on the silicon layer doped with gallium to form a silicon thin layer, further successively a gallium layer thinner than one monolayer is formed on the whole surface of both the mixed crystal thin layer of silicon and germanium and the silicon thin layer and then silicon is grown by two-dimensional nuclear growth to provide a silicon thin layer having a gallium layer thereon formed by surface segregation.

30. A method for making a microstructure body on a substrate, which comprises providing a substrate having a rugged position, forming a layer of a first element, thinner than one monolayer, at the rugged position, controlling a temperature of the substrate such that a second element cannot form a layer on the layer of the first element, and then depositing the second element.

31. A method according to claim 24, wherein a material which is the same as or different from the material of the substrate is filled in a groove formed by removing the first element to form a microstructure body of the filled material.

32. A method according to claim 31, wherein the material to be filled is one which promotes crystal growth of the second element which is deposited subsequently.

33. A method according to claim 32, wherein the material to be filled is gallium.

34. A method according to claim 26, wherein the silicon substrate face is (111) and the vapor deposition temperature of gallium is 500°–650° C.

35. A method according to claim 26, wherein successively the gallium layer is removed by evaporation and silicon is grown by step flow growth on the silicon layer doped with gallium to form a silicon thin layer.

36. A method according to claim 35, wherein successively a gallium layer of one monolayer or less is formed on the whole surface of both the mixed crystal thin layer of silicon and germanium and the silicon thin layer and then silicon is grown by two-dimensional nuclear growth to provide a silicon thin layer having a gallium layer thereon formed by surface segregation.

37. A method for making a microstructure body on a substrate which comprises forming a layer of a first element, thinner than one monolayer, by arranging the first element at a rugged position of the substrate, then forming a layer of at least one second element on a part of the substrate on which the layer of the first element is not formed, and not on the layer of the first element, removing said layer of the first element, so as to form a groove where said layer of the first element had been, and supplying a further element in said groove.

38. A method for making a microstructure body on a substrate which comprises forming a layer of a first element, thinner than one monolayer, by arranging the first element at a rugged position of the substrate, then forming a layer of at least one second element on a part of the substrate on which the layer of the first element is not formed, and not on the layer of the first element, wherein a temperature of the substrate is controlled during the forming of the layer of the at least one second element, such that the layer of the at least one second element is formed on said part of the substrate and not on the layer of the first element.

39. A method for making a microstructure body on a substrate which comprises forming a layer of a first element, thinner than one monolayer, by arranging the first element at a rugged position of the substrate, then forming a layer of at least one second element on a part of the substrate on which the layer of the first element is not formed, and not on the layer of the first element, wherein the substrate comprises a semiconductor, the semiconductor being a single element semiconductor, a III–V group compound semiconductor or a II–VI group compound semiconductor, and wherein the first element is selected from the group consisting of Ag, Cu, Ni, Pd, Pt and Au.

40. A method according to claim 37, wherein said further element is an element which promotes growth of semiconductor crystal.

* * * * *